United States Patent
Tamaki et al.

(10) Patent No.: US 6,300,779 B1
(45) Date of Patent: Oct. 9, 2001

(54) SEMICONDUCTOR DEVICE EVALUATION APPARATUS AND SEMICONDUCTOR DEVICE EVALUATION PROGRAM PRODUCT

(75) Inventors: Naoya Tamaki; Norio Masuda, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/336,623

(22) Filed: Jun. 18, 1999

(30) Foreign Application Priority Data

Aug. 28, 1998 (JP) .................................................. 10-242916

(51) Int. Cl.$^7$ ....................... G01R 31/303; G01R 31/315
(52) U.S. Cl. ........................................... 324/750; 324/765
(58) Field of Search .................................... 324/750, 751, 324/753, 501, 765, 95

(56) References Cited

U.S. PATENT DOCUMENTS

| | | | |
|---|---|---|---|
| 5,028,866 | * 7/1991 | Wiese | 324/750 |
| 5,406,209 | * 4/1995 | Johnson et al. | 324/501 |
| 5,517,110 | * 5/1996 | Soiferman | 324/158.1 |
| 5,521,517 | * 5/1996 | Shida et al. | 324/751 |

FOREIGN PATENT DOCUMENTS

| | | |
|---|---|---|
| 64-65466 | 3/1989 | (JP) . |
| 4-230874 | 8/1992 | (JP) . |
| 5-119089 | 5/1993 | (JP) . |
| 6-58970 | 3/1994 | (JP) . |
| 7-30874 | 1/1995 | (JP) . |
| 9-80098 | 3/1997 | (JP) . |
| 10-38984 | 2/1998 | (JP) . |

OTHER PUBLICATIONS

Japanese Office Action issued Oct. 17, 2000 in a related application with English translation of relevant portion.

"Electromagnetic Compatibility Measurement Procedures for Integrated Circuits", IEC 47A/428/NP New Work Item Proposal, Feb. 1996, published by IEC, pp. 1–26.

"Electromagnetic Emission (EME) Measurement of Integrated Circuits, DC to 1 GHz", IEC 47A/429/NP New Work Item Proposal, Feb. 1996, published by IEC, pp. 1–31.

* cited by examiner

*Primary Examiner*—Ernest Karlsen
(74) *Attorney, Agent, or Firm*—Ostrolenk, Faber, Gerb & Soffen, LLP

(57) ABSTRACT

A semiconductor device evaluation apparatus for correctly measuring emission noise of a semiconductor device includes: an electromagnetic field measurement unit for measuring a two-dimensional electromagnetic field distribution in a plane parallel to an upper surface of a semiconductor device; a distribution image generation unit for not only extracting a distribution of an electromagnetic field higher than a threshold value determined in advance from the electromagnetic field distribution of the semiconductor device measured by the electromagnetic field measurement unit but converting the extracted electromagnetic field distribution to a distribution image in a two-dimensional plane; an image collation unit for collating the distribution image generated by the distribution image generation unit with a projected image, generated in advance, of an interconnect and a lead frame of the semiconductor device; and an emission source specifying unit for specifying an interconnect or a lead frame whose images are superposed, if the images of the electromagnetic field distribution, and the interconnects and lead frames are superposed on each other in collation by the image collation unit, as an emission source.

13 Claims, 15 Drawing Sheets

(Picked-up image)

(Distribution image)

(Collation image)

(Extracted image)

FIG. 13A (Example)
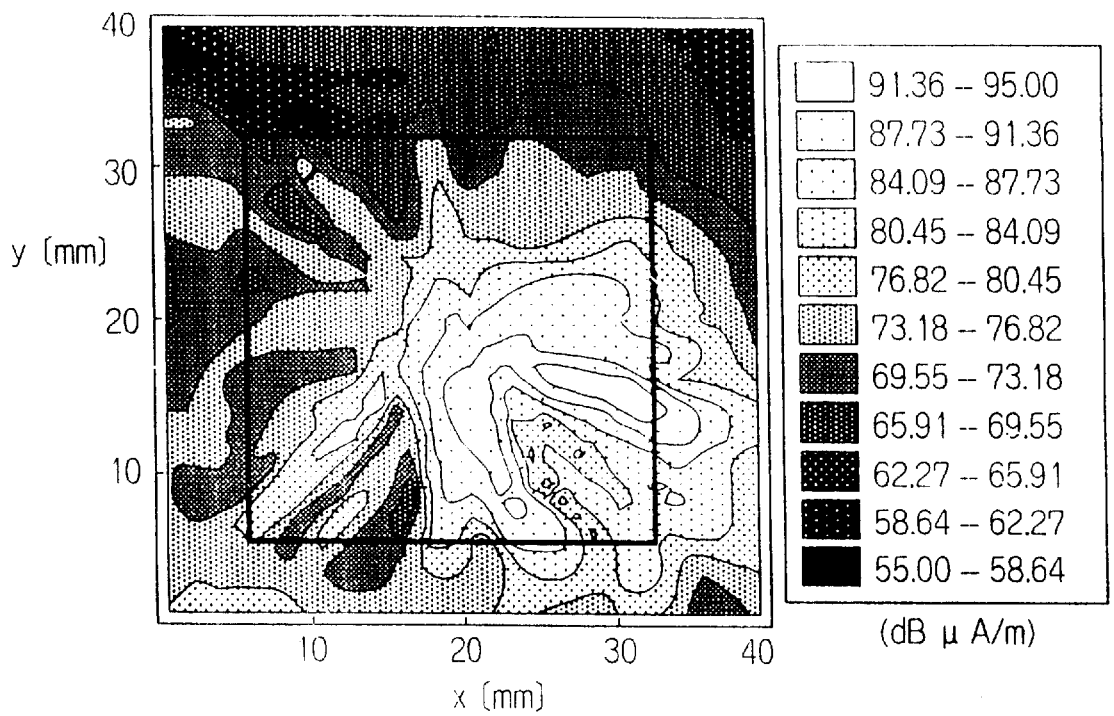
FIG. 13B (Conventional example)
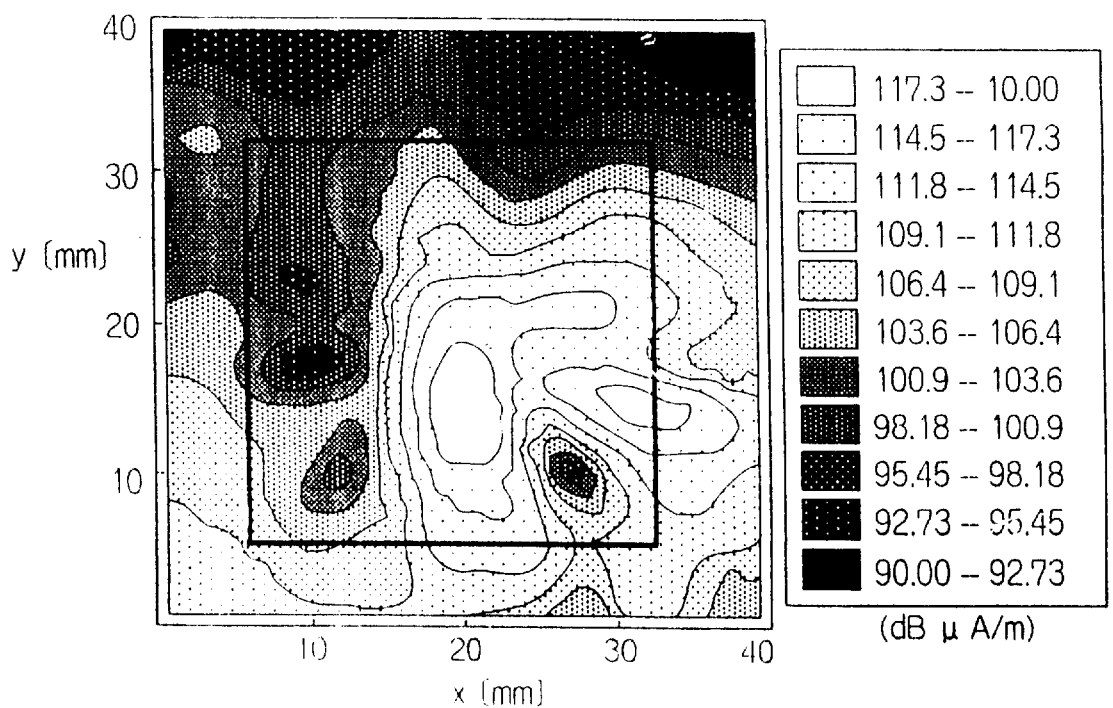

SEMICONDUCTOR DEVICE EVALUATION APPARATUS AND SEMICONDUCTOR DEVICE EVALUATION PROGRAM PRODUCT

BACKGROUND OF THE INVENTION

1. Field of the Invention

The present invention relates to a semiconductor device evaluation apparatus and particularly, to a semiconductor device evaluation apparatus for evaluating an electromagnetic near-field strength of a semiconductor device. The present invention further relates to a magnetic field sensor suitable for use in the semiconductor device evaluation apparatus.

2. Description of the Prior Art

EMI (electromagnetic interference) evaluation of electronic equipment is to measure an emitted far-field of the electronic equipment according to measurement methods stipulated in various kinds of standards and evaluate whether or not an emission quantity meets a standard. If the standard is not met, further detailed evaluation is performed at levels of a case and a print circuit board of the electronic equipment as evaluation objects in order to specify a problematic part in the equipment.

As a fundamental evaluation method, there can be named a method in which electrical parameters such as a current, a voltage and an electromagnetic near-field and the like at parts of an object for evaluation are measured by proper means and a part which has a possibility to cause a problem in terms of electromagnetic compatibility is thus specified. For example, in Japanese Patent Application Laid-Open No. 4-230874, there is disclosed a method in which a two-dimensional electromagnetic strength measurement apparatus is employed, a print circuit board built in electronic equipment is extracted therefrom, a magnetic field sensor is disposed in the vicinity of the print circuit board, a two-dimensional magnetic field distribution is measured in a plane which is parallel to the board and it is eventually evaluated that a part where a high magnetic strength is measured has a high possibility of being a noise source.

In such a conventional example, in many cases, there has been adopted a method in which, at first, a problematic part and a mechanism of a problematic circuit function are selected by narrowing candidates from a list thereof according to experiences and expertise of a person in measurement and an optimal EMC countermeasure is attained. For a countermeasure in an EMC, it is important to conduct non-contact measurement in order to suppress, to the lowest level possible, an electrical influence on a circuit function of the electronic equipment which is an evaluation object. When a semiconductor device itself (for example, a semiconductor package) as an object for evaluation is, in a non-contact manner, measured to specify an internal problematic part as in the case of electronic equipment, there arises a necessity for an electromagnetic sensor with a spatially high resolving power.

However, a practical electromagnetic sensor adaptable for a semiconductor device has not been known.

As a noise evaluation method of a semiconductor device, there is available a document: "Electromagnetic Emission (EME) Measurement of Integrated Circuits, DC to 1 GHz" IEC 47A/429/NP NEW WORK ITEM PROPOSAL, 1996.2, published by IEC in which a measurement method for emission noise from a semiconductor device is shown. Besides, there is also available a document: "Electromagnetic Compatibility to Measurement Procedures for Integrated Circuits" IEC 47A/428/NP NEW WORK ITEM PROPOSAL, 1996.2, published by IEC in which a measurement method for conduction noise which occurs in each pin of a semiconductor device is shown.

Two measurement methods for an emission noise from a semiconductor device package are shown. One will be shown below. A semiconductor device which is an object for evaluation is mounted on a surface of a print circuit board and peripheral circuitry for operating the semiconductor device is constructed on the rear surface thereof. The print circuit board is fixed on a plane in the top portion of a TEM cell so that a surface of the print circuit board on which a semiconductor device is mounted resides in the inside of the TEM cell. One end of the TEM cell is constructed as a reflection-free terminal and the other end connected to a spectrum analyzer, and thereby emission noise from the semiconductor device only can be measured excluding influences from the peripheral circuitry.

A second method will be shown below. A semiconductor device as an object for evaluation is mounted on a surface of a print circuit board and peripheral circuitry for operating the semiconductor device is constructed on the rear surface thereof. The print circuit board is disposed with the surface on which the semiconductor device is mounted facing upward and a shielded loop constructed from a semi-rigid coaxial cable is arranged above the print circuit board. The vicinity of the semiconductor device is scanned with the shielded loop along a plane parallel to the print circuit board by a scan mechanism and thereby emission noise from the semiconductor device only can be measured. In this case, the maximal value of outputs at measurement sites is evaluated as a problematic site to specify.

Then, a measurement method for conduction noise which occurs in each pin of a semiconductor device package will be shown below. A structure comprises a test board for mounting a semiconductor device which is an object for evaluation and a main board for connecting the test board and a spectrum analyzer thereby. The semiconductor device is mounted in the center of the circular test board and the test board is attached to the main board in the center thereof. Interconnects are provided on each of the two boards radially toward the outside of the board and conduction noise from the pins of the semiconductor device is measured by the spectrum analyzer which is connected to the pins through connectors of a coaxial type mounted in the vicinity of the outer periphery of the main board.

As other examples, the following methods are named. For example, in Japanese Patent Application Laid-Open No. 64-65466, there is disclosed an identification method for an electromagnetic field noise generating part in which a reference plane is imagined which intersects electronic equipment, an arbitrary plane which is in parallel with the reference is scanned with an antenna, strengths of electromagnetic field noise and noise generating sites are sampled, and thereby a generation distribution map for electromagnetic noise of the electronic equipment as viewed from the arbitrary plane set in advance is expressed in the form of a contour map. Besides, in Japanese Patent Application Laid-Open No. 5-119089, there is disclosed an electromagnetic radiation visualization apparatus, in which a variable-length dipole antenna 3 of a measurement unit 1 is fixed in length which matches a measurement frequency and the antenna 3 is moved by a three-dimensional movement mechanism 4 in an anechoic electromagnetically chamber 7 while scanning. At this point, the interior of the electromagnetically anechoic chamber 7 is optically made dark and a brightness of a lamp 2 which is proportional to an electric field strength at each measurement site is recorded by a sterocamera 5 with exposure. Furthermore, in Japanese Patent Application Laid-Open No. 6-58970, there is disclosed an invention having an object to provide an EMI measurement apparatus which can three-dimensionally measure noise along X-Y-Z directions on the front side of a print wiring board on which electronic parts with much of unnecessary radiation are mounted, and which can two-dimensionally measure noise along X-Y directions on the rear side thereof. This is an EMI measurement apparatus which has a construction in which a print wiring board is set to an antenna for measuring an interference in which winding coils are arranged in an array and a magnetic near-field probe is mounted on the fore end arm of a robot which can be driven along X-Y-Z directions on the front side of the print wiring board in order to measure a noise generating source of the print wiring board on which an electronic part which is rich in unnecessary radiation is mounted, whereby a distribution of magnetic field strengths in unnecessary radiation on both sides, front and rear, is measured. In addition, in Japanese Patent Application Laid-Open No. 9-80098, there is disclosed an EMC probe, by which a spatial resolving power is increased and a measurement band region is sufficiently secured. This comprises a flexible board whose surface is insulated and a winding 11 with a single turn or a plurality of turns for detecting a magnetic near-field vector of an object for measurement, while being disposed obliquely, the winding being constructed from a metal thin film formed in a plane on the board.

BRIEF SUMMARY OF THE INVENTION

Object of the Invention

Problematic points of a measurement method for emission noise from a semiconductor device package will be described below. First of all, problematic points of a method using a TEM cell will be described.

A first problematic point is that there is available no detailed standards for designing of a print circuit board on which a semiconductor device is mounted and thus an evaluation result depends on a design of the print circuit board. Besides, since a print circuit board on which a semiconductor device is mounted is square, there can be four ways to mount the semiconductor device, but a result is different according to a way to be mounted.

The reason why is considered that an electromagnetic wave emitted from a surface of a print circuit board on which a semiconductor device is mounted has a polarized wave and a pin position whose emission is large in quantity is changed, whereby emission characteristics are largely changed.

A second problematic point is that if a quantity of emission noise exceeds a tolerable level, though the emission noise can correctly be measured, a countermeasure is required. However, this method is very hard to specifically locate a problematic site.

The reason why is that since the semiconductor device is present in the TEM cell, it is impossible to correctly confirm what part of the semiconductor device has a problem.

A third problematic point is that a print circuit board is required to be prepared for each semiconductor device for evaluation, which entails cost in terms of time and economy.

A fourth problematic point is that since the semiconductor devices are evaluated under constant conditions, evaluation results have chances in which the results are not effective for use conditions by a user.

In addition, problematic points of a method using a shielded loop will be described.

A first problematic point is that there is available no detailed standards for designing of a print circuit board on which a semiconductor device is mounted and thus an evaluation result depends on a design of the print circuit board.

The reason why is considered that an electromagnetic wave emitted from a surface of a print circuit board on which a semiconductor device is mounted has a polarized wave and thereby emission characteristics are largely changed.

A second problematic point is that if a quantity of emission noise exceeds a tolerable level, though the emission noise can correctly be measured, a countermeasure is required. However, this method is very hard to specifically locate a problematic site.

The reason why is that a small-sized type is hard to be realized since the shielded loop is prepared by a semi-rigid coaxial cable and as a result, a structure has an insufficient spatial resolving power and it is impossible to correctly confirm what part of a semiconductor device has a large emission.

A third problematic point is that a print circuit board is required to be prepared for each semiconductor device for evaluation, which entails cost in terms of time and economy.

A fourth problematic point is that since the semiconductor devices are evaluated under constant conditions, evaluation results have chances in which the results are not effective for use conditions by a user.

Furthermore, problematic points of a measurement method for conduction noise which occurs in each pin of a semiconductor package will be described below.

A first problematic point is that since electrical connection between the test board and the main board depends on point contact formed by pressure bonding of metal pin, transmission characteristics come to be in disorder under a high frequency band close to 1 GHz.

The reason why is considered that an impedance becomes discontinuous in the point contact portion.

A second problematic point is that a test board has to be newly prepared for each semiconductor device for evaluation, which entails cost in terms of time and economy.

A third problematic point is that since the semiconductor devices are evaluated under constant conditions, evaluation results have chances in which the results are not effective for use conditions by a user.

A fourth problematic point is that evaluation of a semiconductor device which requires circuitry with a large construction is hard to be performed because of requirement for a large space.

In this way, conventional examples have had inconveniences that, firstly, it is hard to correctly measure emission noise of a semiconductor device and secondly, even if emission noise can be measured, it is impossible to specify what part in the semiconductor device is problematic.

SUMMARY OF THE INVENTION

It is an object of the present invention to provide a magnetic field sensor by which the above described inconveniences which conventional examples have had are improved and especially, emission noise of a semiconductor device can correctly be measured. It is another object of the present invention to provide a semiconductor device evaluation apparatus with good workability and high reliability which can perform EMI evaluation of a semiconductor device.

The present invention, therefore, has a configuration which comprises: an electromagnetic field measurement unit for measuring an electromagnetic field distribution emitted from a semiconductor device; an electromagnetic field distribution extracting unit for extracting a distribution of an electromagnetic field higher than a threshold value determined in advance and positional information of the distribution from an electromagnetic field distribution of a semiconductor device which is measured by the electromagnetic field measurement unit; and a part specifying unit for specifying a part of an object for measurement an electromagnetic field emitted from which is high among parts of the object for measurement based on the positional information of the electromagnetic field distribution which is extracted by the electromagnetic field distribution extracting unit. This allows the objects described above to be attained.

The electromagnetic field measurement unit measures an electromagnetic field distribution which is emitted from a semiconductor device. Then, the electromagnetic field distribution extracting unit extracts a distribution of an electromagnetic field higher than a threshold value determined in advance and positional information of the distribution from an electromagnetic field of the semiconductor device. The positional information may be, for example, a distribution image in which information on whether or not an electromagnetic field exceeds the threshold is stored in a pixel corresponding to the information. The part specifying unit specifies a part an electromagnetic field of whose emission is high based on the positional information of the electromagnetic field distribution. For example, a part of a semiconductor device such as an interconnect or a lead frame is specified. Thus, evaluation of an electromagnetic field emitted from the semiconductor device is effected.

BRIEF DESCRIPTION OF THE DRAWINGS

FIG. 3(A) is a representation showing an example of a picked-up image, FIG. 3(B) is a representation showing an example of a distribution image, FIG. 3(C) is a representation showing an example of a collation image, and FIG. 3(D) is a representation showing an example of a extracted image;

FIG. 10(a) is a front view of a multilayer magnetic field sensor having a base member at the lowest part and FIG. 10(b) is a front view of a multilayer magnetic field sensor having a plurality of base members at the lowest part;

FIGS. 13(A), (B) are representations showing measurement results of two-dimensional magnetic field distribution, and FIG. 13(A) is a representation showing a measurement result in the embodiment and FIG. 13(B) is a representation showing a measurement results in a conventional example;

FIG. 14(A) is a graph showing values of a calibration coefficient for an amplitude and FIG. 14 (B) is a graph showing values of a calibration coefficient for a phase;

DETAILED DESCRIPTION OF THE PREFERRED EMBODIMENTS

Figure 1:
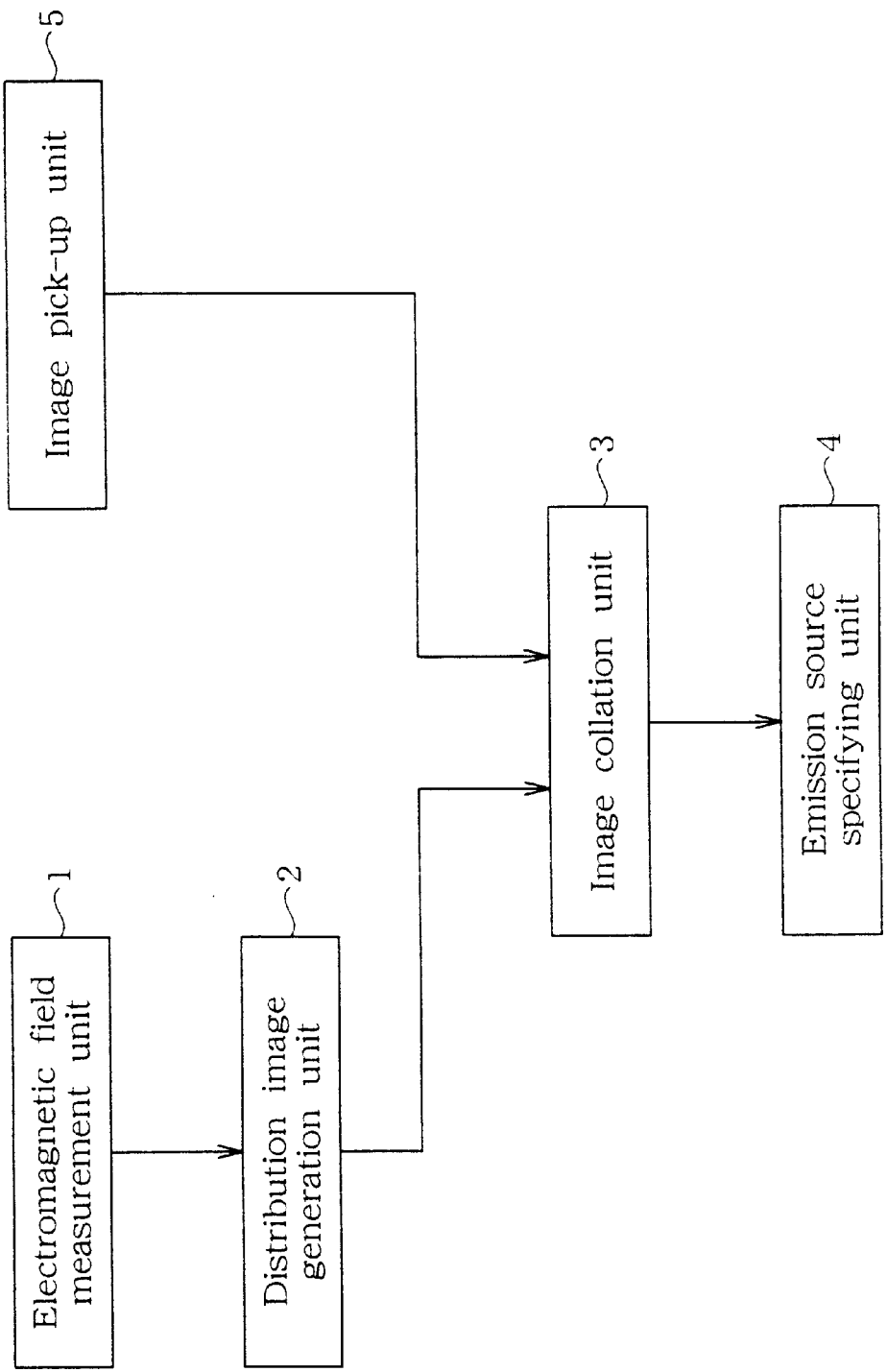
FIG. 1 is a block diagram showing a schematic configuration of a semiconductor device evaluation apparatus according to the present invention.

Then, an embodiment of the present invention will be detailed with reference to the accompanying drawings. FIG. 1 shows a configuration of the present invention. A semiconductor device evaluation apparatus comprises: an electromagnetic field measurement unit 1 for measuring a two-dimensional electromagnetic field distribution in a plane parallel to an upper surface of a semiconductor device; a distribution image generation unit 2 for not only extracting a distribution of an electromagnetic field higher than a threshold value determined in advance from the electromagnetic field distribution of the semiconductor device measured by the electromagnetic field measurement unit 1 but converting the extracted electromagnetic field distribution to a distribution image in a two-dimensional plane; an image collation unit 3 for collating the distribution image generated by the distribution image generation unit 2 with a projected image, generated in advance, of an interconnect and a lead frame of the semiconductor device; and an emission source specifying unit 4 for specifying an interconnect or a lead frame whose images are superposed, as an emission source if the images of the electromagnetic field distribution, and the interconnects and lead frames are superposed on each other in collation by the image collation unit 3.

The electromagnetic field measurement unit 1, for example, comprises: an electromagnetic field sensor 206 for measuring a magnetic field in the vicinity of a semiconductor device; a measurement unit 210 for measuring an emitted electromagnetic field of the semiconductor device using the electromagnetic field sensor 206; and a scan unit 207 for scanning with the magnetic field sensor 206 in the vicinity of the semiconductor device. The magnetic field sensor, in a preferable embodiment, comprises: a signal layer having a signal line; and a ground layer which is a ground for the signal layer. In addition, the electromagnetic field measurement unit 1 may further comprise an attenuator 47 connected to the electromagnetic field sensor 206 for eliminating an influence of either electric or magnetic field in measuring one of them.

Figure 2:
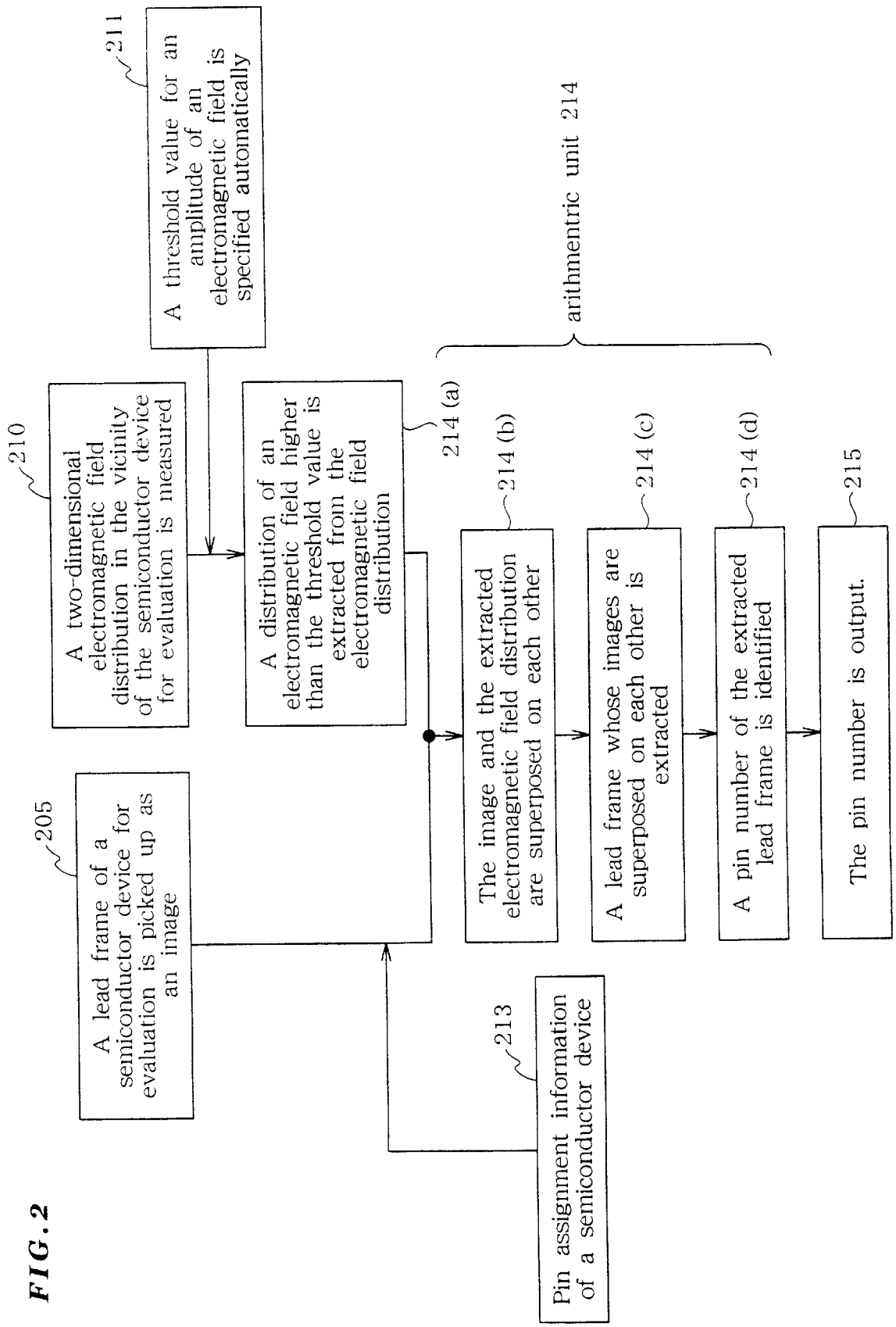
FIG. 2 is a flowchart showing an example of processing by the semiconductor device evaluation apparatus shown in FIG. 1.
Figure 3A:
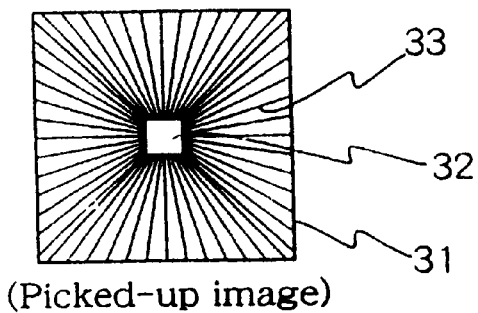
FIGS. 3(A) to (D) are representations for illustrating examples of images used in steps shown in FIG. 2.

FIG. 2 is a flowchart showing an example of processing by the configuration shown in FIG. 1. In the figure, numerals respectively indicate constituents performing portions of the overall processing. As shown in FIG. 2, as a pretreatment, a lead frame of a semiconductor device for evaluation are picked-up as an image (205). An example of a picked-up image 31 is shown in FIG. 3(A). In the picked up image 31, a semiconductor device chip 32 and a lead frame 33 are shown. In addition, pin assignment information of the semiconductor device is added to the image 31 as an input (213).

Figure 3B:
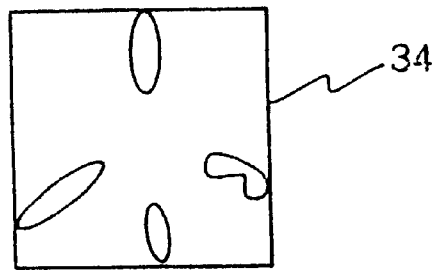
Figure 3C:
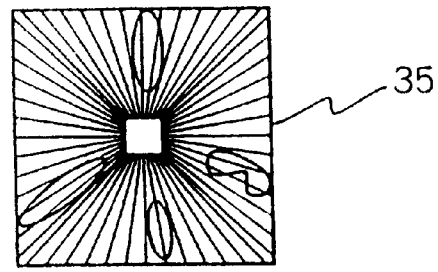
Figure 3D:
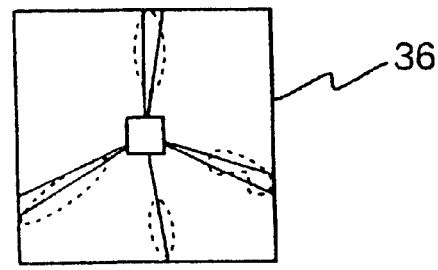

Then, a two-dimensional electromagnetic field distribution in the vicinity of the semiconductor device for evaluation is measured (210). A threshold value for an amplitude of an electromagnetic field is specified automatically or by manual setting (211). Besides, a distribution of electromagnetic field which exceeds the threshold value is extracted (214 (a)). An example of an image of the electromagnetic field distribution 34 is shown in FIG. 3(B). Then, the distribution image 34 is superposed on the picked-up image 31 as shown in FIG. 3(C) (214(b)). Furthermore, a lead frame whose images are superposed on each other is extracted (214(c)). An example of an extracted image is shown in FIG. 3(D). Subsequently, a pin number of a lead frame which has been extracted is identified (214 (d)) and the pin number is transmitted as an output. Not only pin numbers but strengths of electromagnetic field of all the pins may be transmitted as outputs in some of embodiments.

In the embodiment in which strengths of an electromagnetic field of all the pins are transmitted as outputs, the distribution image generation unit 2 is provided with a function of segmenting an electromagnetic field emitted from the semiconductor device between the maximum and minimum strength level into a plurality of emission strength level intervals. In this case, the emission source specifying unit 4 is preferably provided with a function of specifying an interconnect or a lead frame which corresponds to each of the emission strength level intervals. Besides, when emission strengths of lead frames are determined, the emission source specifying unit 4 is preferably provided with a function of not only rearranging lead frames in the order of emission strength level interval, but also transmitting the rearranged lead frame information in the new order of the lead frames as an output to the outside. In order that emission strengths of all lead frames are determined, a strength level interval is narrowed till no change appears in the newer order of the lead frames after rearrangement.

In an embodiment, the emission source specifying unit 4 is provided with a function which transmits, as an output to the outside, synthesized information of lead frames rearranged according to the emission strength level intervals and pin assignment made by referencing to the pin assignment database showing functions of the lead frames in a circuit. Thus, evaluation data for the semiconductor device are generated. Semiconductor device evaluation data provided to a user according to the embodiment comprises, in a preferred embodiment: pin assignment data each of which shows a function in a circuit of a corresponding lead frame of the semiconductor device; electromagnetic field strength data each of which shows an electromagnetic field strength which has been sensed by the electromagnetic field sensor on each pin; and sets of order data each set of which defines a level in the order of electromagnetic field strength for a pin corresponding to the electromagnetic field strength data. Herein, pin assignment data and electromagnetic field strength data are related with each other by a level in the order according to order data. According to data with such a structure, pin assignment data showing pin functions and electromagnetic field strengths are indicated in the decreasing order of electromagnetic field strength. With this data structure, a lead frame which is an emission source can be specified with ease, when an emitted electromagnetic field of the semiconductor device exceeds an allowable level, information which is useful for a user to take measure to cope with the case, can be supplied to the user since even a function in circuit of a lead frame in question can be displayed.

Various functions of the distribution image generation unit 2, the image collation unit 3 and the emission source specifying unit 4 can be realized by a processing apparatus such as a computer or the like. In this case, the processing apparatus comprises: a central processing unit such as CPU; a main storage unit, an input/output unit; an auxiliary storage unit; and a display. Programs which are used for the computer to execute the functions described above are stored in the auxiliary storage unit. Storage of the programs to the auxiliary storage unit may be effected through a communication line in addition to a method in which the programs are introduced from a storage medium such as a CD-ROM or the like by way of the input/output control unit.

The programs comprises as commands to run on the processing apparatus: a command extracting an electromagnetic field distribution higher than a threshold value determined in advance from an electromagnetic field distribution in the vicinity of a semiconductor device measured by the electromagnetic field sensor 206; a command of converting the electromagnetic field distribution to a distribution image in a two-dimensional plane; a command of collating the distribution image with a projected image of interconnects and lead frames of the semiconductor device which have been generated; a command of specifying an interconnect or a lead frame which is superposed on each other as an emission source, if the images of the electromagnetic field distribution, and the interconnects and lead frames are superposed on one another by the collation. These commands each of which forces a function to be executed include another program which is used to have the computer realize a desired function in dependence on the operating system and other application programs of the processing apparatus. It is needless to say that the processing apparatus may entirely be controlled by the program only.

Various functions of the distribution image generation unit and the emission source specifying unit can be realized by logic circuits. The data for evaluation of a semiconductor device described above may also be constructed from a logic circuit.

Examples
<Semiconductor Device Evaluation Apparatus>

Figure 4:
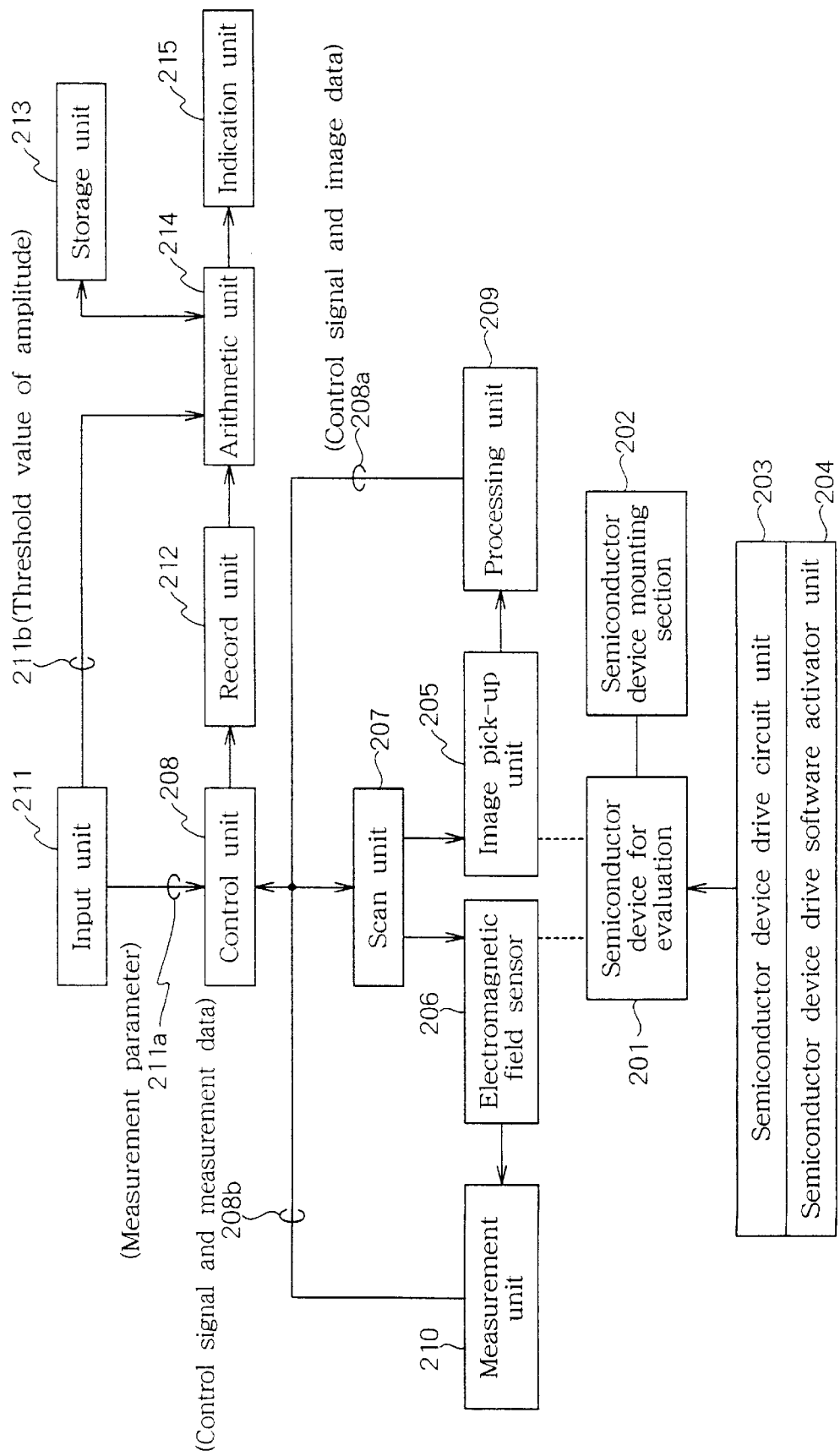
FIG. 4 is a block diagram showing a configuration of an embodiment of the present invention.

FIG. 4 is a block diagram showing a configuration of an embodiment of the present invention. In an example shown in FIG. 4, the semiconductor device evaluation apparatus comprises: a mounting section 202 for mounting a semiconductor device 201 for evaluation; a semiconductor device drive unit 203, 204 for driving the semiconductor device 201 mounted on the mounting section 202; an electromagnetic field sensor 206 for sensing an electromagnetic field emitted from the semiconductor device 201 which is driven by the semiconductor device drive unit 203, 204; a measurement unit 210 for measuring an output of the electromagnetic field sensor 206; an image pick-up unit 205 for taking a photograph of patterns of interconnects or lead frames of the semiconductor device 201; a scan unit 207 for conducting scanning with the electromagnetic field sensor 206 and the image pick-up unit 205 in three coordinate axis directions;

an input unit 211 to which information on a scan range, a scan pitch, a scan speed of the scan unit 207 and the like, and information on settings of the image pick-up unit and the measurement unit and the like are supplied as inputs; and a control unit 208 for controlling the scan unit 207, the image pick-up unit 205 and the measurement unit 210 according to information which is supplied as inputs to the input unit 211, wherein the control unit also receives information from the measurement unit 210 and the image pick-up unit 205. In the example shown in FIG. 4, an output from the image pick-up unit 205 is supplied to the control unit 208 as an input by way of the processing unit 209.

The semiconductor device evaluation apparatus further comprises a record unit 212 which prepare and stores a two-dimensional electromagnetic field distribution based on information obtained from the measuring unit 210 and the image pick-up unit 205 by way of the control unit 208; an arithmetic unit 214 which not only extracts an emitted electromagnetic field distribution higher than a threshold value which can arbitrarily be set based on a two-dimensional electromagnetic field distribution which is prepared in the record unit 212, but also specifies an interconnect and a lead frame of the semiconductor device which are large in emission quantity by projecting the extracted electromagnetic field distribution on the image from the image pick-up unit 205; and an indication unit 215 for indicating the two-dimensional electromagnetic field distribution prepared by the record unit 212, the emitted electromagnetic field distribution with a high strength having a linear shape prepared by the arithmetic unit 214 and the image from the image pick-up unit 205. Herein, the semiconductor device drive unit 203, 204 has at least one of a semiconductor device drive circuit unit 203 and a semiconductor device drive software activation unit 204.

The semiconductor device 201 which is an object for evaluation is fixed by the semiconductor device mounting section 202. The semiconductor device 201 is connected to at least one of the semiconductor device drive circuit unit 203 and the semiconductor device drive software activation unit 204. The image pick-up unit 205 and the electromagnetic field sensor 206 are fixed on the scan unit 207 and connected to the control unit 208. An output of the image pick-up unit 205 is connected to the control unit 208 by way of the processing unit 209 and an output of the electromagnetic field sensor 206 is connected to the control unit 208 by way of the measurement unit 210. The control unit 208 to which the input unit 211 is connected is connected to the record unit 212. The record unit 212 is connected to the indication unit 215 by way of the arithmetic unit 214 to which the storage unit 213 is connected.

When the semiconductor device 201 for evaluation is fixed on the semiconductor device mounting section 202, the image pick-up unit 205 which is fixed on the scan unit 207 which can perform scanning in the three coordinate axis directions takes a photograph of lead frames and interconnects of the semiconductor chip or the semiconductor device package for evaluation in an evaluation region thereof. A photographic result is stored as a picked-up image 31 shown in FIG. 3. The picked-up image 31 is constructed from a lead frame image 33 and a semiconductor chip image 32. The picked-up image 31 is processed in the digital form according a necessity and thereafter, stored in the record unit 212 as electronic information.

Then, the semiconductor device 201 for evaluation is set into an operating state by the semiconductor device drive circuit unit 202 and the semiconductor device drive software activation unit 203. A plane in parallel with a upper surface of the semiconductor device 201 for evaluation is scanned over an evaluation region with the electromagnetic field sensor 206 fixed on the scanning unit 207 which can perform scanning in the three coordinate axis directions and an emitted electromagnetic field from the semiconductor device 201 for evaluation is sensed and measured by the measurement unit 210 and the measured two-dimensional electromagnetic field distribution image 34 is stored in the record unit 212 as electronic information.

Then, a unit for specifying a lead frame will be described. A threshold value g of amplitude is given to the arithmetic unit 214 as an input from the input unit 211 and an electromagnetic field distribution 34 with an amplitude larger than a threshold value is extracted in the arithmetic unit 214. Then, the picked-up image 31 and an image of thus extracted electromagnetic field distribution 34 are superposed on each other while positioning both images using reference points respectively provided in them. A resulted image is adopted as the collation image 35. Then, a lead frame which superposes the extracted electromagnetic field distribution 34 is further extracted to obtain the extracted image 36.

There are several methods to obtain the image 36. An example of the extraction methods will be shown below. The image 31 of a lead frame is segmented into n×n images. Therefore, x is segmented as x=x1 ... xn and y is also segmented as y=y1 ... yn. Only the image of the lead frame 33 left behind after the semiconductor chip image at the center is eliminated from the image 31 is expressed as a function A (x, y). Since a semiconductor chip is normally rectangular for simplicity, the extraction can be executed comparatively with ease by using a general image processing method. Each lead frame is extracted from an image of the function A (x, y). Since a lead frame is an image having a linear shape, the extraction is performed using a method in which an image having a linear shape is extracted. The results are classified into groups, to form a set, each of which is composed of 9 images for each lead frame, in which the set is named as LF.

LF={A1 (x, y, s1, 11, R1), A2 (x, y, s2, 12, R2), A31 (x, y, s3, 13, R3) ... Ap (x, y, sp, 1p, Rp)}

The x and y are coordinates and the sp is a numerical value which is assigned to an image. At this point, in this set, the sp given is 1. A number of a lead frame which is obtained with reference to the pin assignment information of a semiconductor device is given to 1k. Rk is a parameter which shows a level in the order of strength level interval which is ordered by strength of emission from a lead frame as described later.

A set of pixels which are not included in LF is named as A0 (x, y, s0, 10) among A (x, y). Herein, there is given s0=0. Since there is no lead frame, there is given 1o =0. With the settings, the following equation (1) is obtained. Then, an image 34 is expressed by B (x, y) and pixels in a region which exceeds a threshold value are given 1 and pixels which are lower than the threshold are given 0.

The following relations are set: B (x, g):=1 in the coordinates where an amplitude of an electromagnetic field is equal to or larger than a threshold value and B (x, y):=0 in the coordinates where an amplitude of an electromagnetic field is less than a threshold value.

Herein, an arithmetic operation according to the equation (2) is performed for each set B (x, y). [Equation 1]

$$A(x, y, s, l) = \sum_{k=0}^{x} Ak(x, y, sk, lk) \quad (1)$$

$$qk = \sum_{x=1}^{x} \sum_{y=1}^{x} \{Ak(x, y, sk, lk) \cdot B(x, y)\} \quad (2)$$

Herein, the symbol "·" in the equation (2) is a symbol by which an arithmetic operation according to the rule of binary operation such as 0·0=0, 1·0=0, 1·1=1 is operated. Accordingly, only when a lead frame and an extracted distribution at which an electromagnetic field strength is high are superposed on each other, a logical multiplication assumes 1. That is, qk ≧1. If there is no superposition at all, qk=0. All values of k with which qk ≧1 are obtained. Values k which are sequentially obtained are added to a set named as Ck. The description made above is on processing performed in 214(a) to (d) of FIG. 2.

Then, in 215, the name of a pin is obtained based on a number 1k of a lead frame with reference to the pin assignment information 215 of the semiconductor device from the set Ck and the name and the number 1k are transmitted as outputs. In the above described way, a pin with a high electromagnetic field strength emitted therefrom can be specified.

Since a person who conducts measurement can set a threshold value g to any value, each of lead frames can be specified while a value g is changed from the maximum value of the measured electromagnetic field strength to the minimum value thereof. For example, assume that the maximum and the minimum values of the measured electromagnetic field distribution F (x, y) are respectively Fmax and Fmin. Then, a strength space between the Fmax and Fmin is segmented into n intervals as in the equation (3).

$$h=(F\max-F\min)/n \quad \text{Equation (3)}$$

A threshold value is set at Fmax−h. Herein, if an operation in which a lead frame is specified is performed as described previously, a lead frame which emits a strong emission can be specified. Rk of the lead frame which has been thus specified is stored with 1. The number 1 is the number with which a level in the order of strength is judged.

Then, a g is set at Fmax−2h and a lead frame is specified. Herein, Rk of the lead frame which has been specified is stored with 2. At this point, the lead frame which was previously specified is excluded. When threshold values g are sequentially changed as in such a way from Fmax−2h, Fmax−3h . . . and to Fmax−Fmin while the operation is repeated with the change of a threshold value going on, all lead frames can respectively be classified into corresponding strength level intervals with setting of the threshold value g as an emissive power section.

If the number n of segmentation is larger, a finer classification can be realized and the classification can be performed in such manner that all lead frames can respectively be specified into corresponding strength level intervals. In this case, it has to be determined what the maximum number of segmentation is acceptable, but all that need to be done for the determination is, repetition of segmentation operation and classification of lead frames into strength level intervals till the numbers of levels in the order of strength level intervals, that is the values of R1 . . . Rp are not changed any more in newer classification even if the number of segmentation is further increased at which repetition of the segmentation operation is terminated. If a number in the order in Rk, 1p and pin assignment information (a name of a pin) of the semiconductor device are transmitted together as outputs, the person who conducts measurement can recognize lead frames in the decreasing order of emission strength.

In an desirable example, there is preferably provided with a function which calculates a current value in the semiconductor device which is a cause of an emitted electromagnetic field based on a voltage showing a magnetic field sensed by the electromagnetic field sensor 206 and a magnetic permeability of a medium surrounding the semiconductor device. That is, while, in the above example, a magnetic field distribution is measured, the magnetic field distribution can be converted to a current distribution by simple calculation if a model can be conceived which combines a magnetic field and a current. An output of a magnetic field sensor is given by a voltage corresponding to a change in a magnetic field with respect to time in a plane including a loop and expressed by the following equation (4). Herein, a dot placed on the top of a parameter means that the parameter is a complex number. At this point, a calibration coefficient to convert an output voltage to a magnetic field is defined by the following equation (5). A current which flows along an endless straight conductor is given by the following equation (6) from a magnetic field. According to the equation (6), a current can be obtained from an output voltage of a magnetic field sensor.

$$\dot{V} = -\mu S \left[ \frac{d\dot{H}}{dt} \right] \quad (4)$$

$$\dot{F} = \dot{H}/\dot{V} \quad (5)$$

$$\dot{I} = 2\pi r \dot{F} \dot{V} \quad (6)$$

$\dot{V}$: voltage $\dot{H}$: magnetic field $\dot{I}$: current $\pi$: magnetic permeability of a surrounding medium $S$: area of a loop $r$: the shortest distance from a straight conductor to a measurement point of a magnetic field A dot on the top of a parameter expresses that the parameter is a complex number.

<Electromagnetic Field Sensor>

Figure 5:
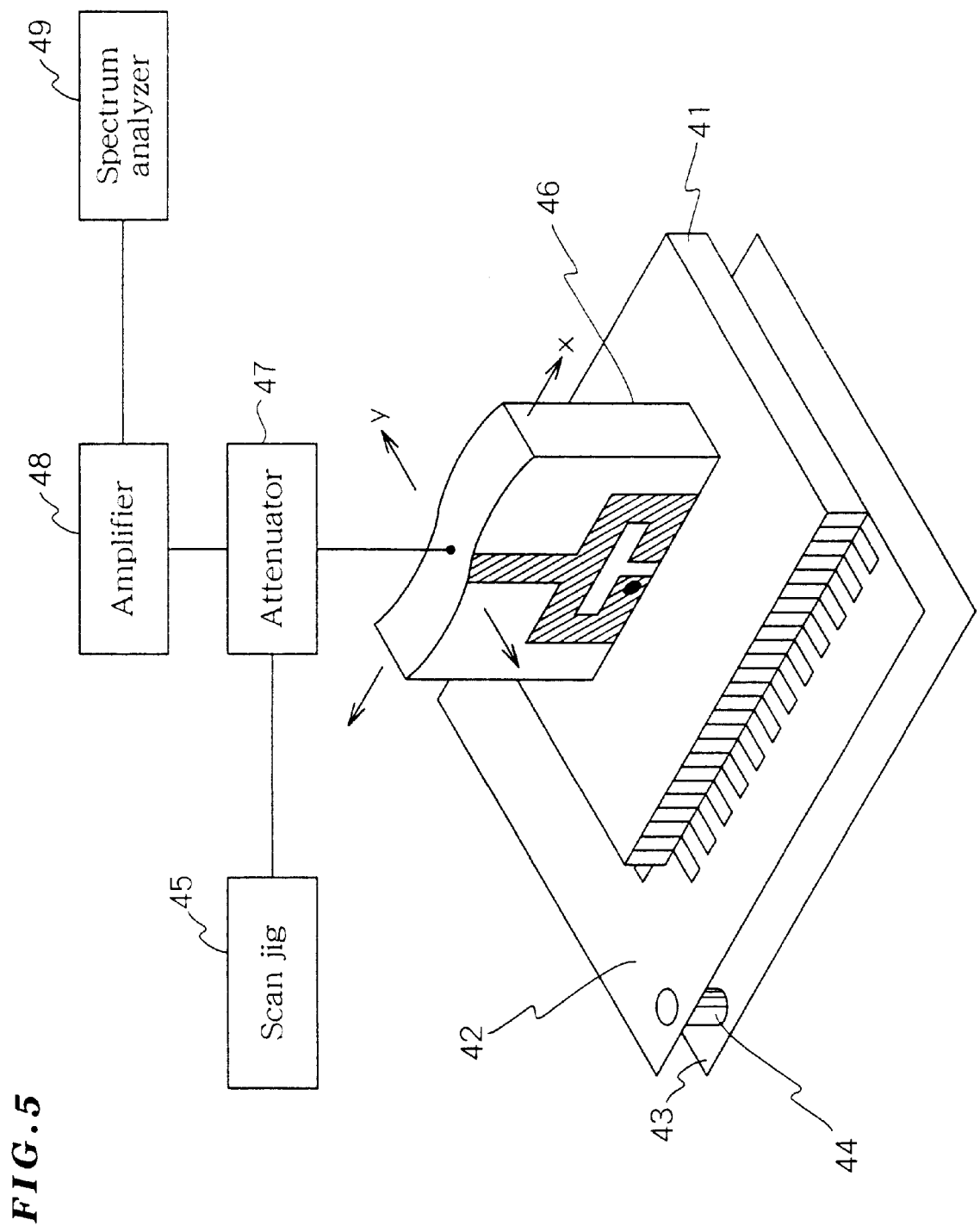
FIG. 5 is a block diagram showing a configuration of an electromagnetic field sensor and a measurement unit shown in FIG. 4.
Figure 6:
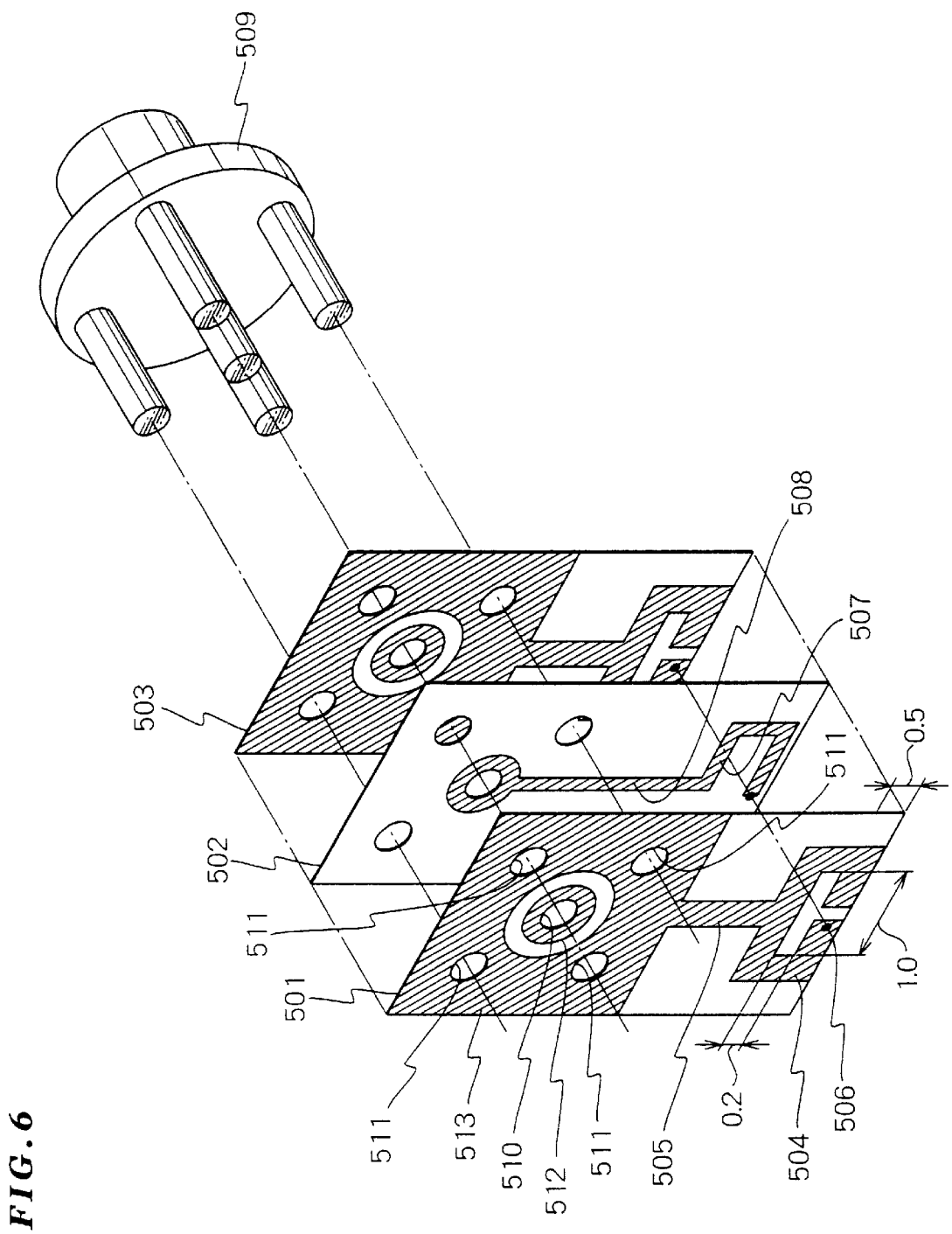
FIG. 6 is a perspective view showing a detailed configuration of the multilayer magnetic field sensor shown in FIG. 5.

In FIG. 5, detailed constructions of the electromagnetic field sensor 206 and the measurement unit 249 are shown. In an example shown in FIG. 5, an LSI package 41 of a QFP type which is mounted on a print circuit board is an object for evaluation. A power source which is electromagnetically shielded is connected to the print circuit board 42 and the whole of the print circuit board 42 is fixed on a jig 43 which uses a metal plate with no plasticity using screws 44. A multilayer magnetic field sensor 46 shown in FIG. 6 is fixed on a scan jig 45 which can perform scanning in the three coordinate axis directions. An output of the magnetic field sensor 46 is measured by a spectrum analyzer 49 by way of an attenuator 47 and an amplifier 48.

Figure 16:
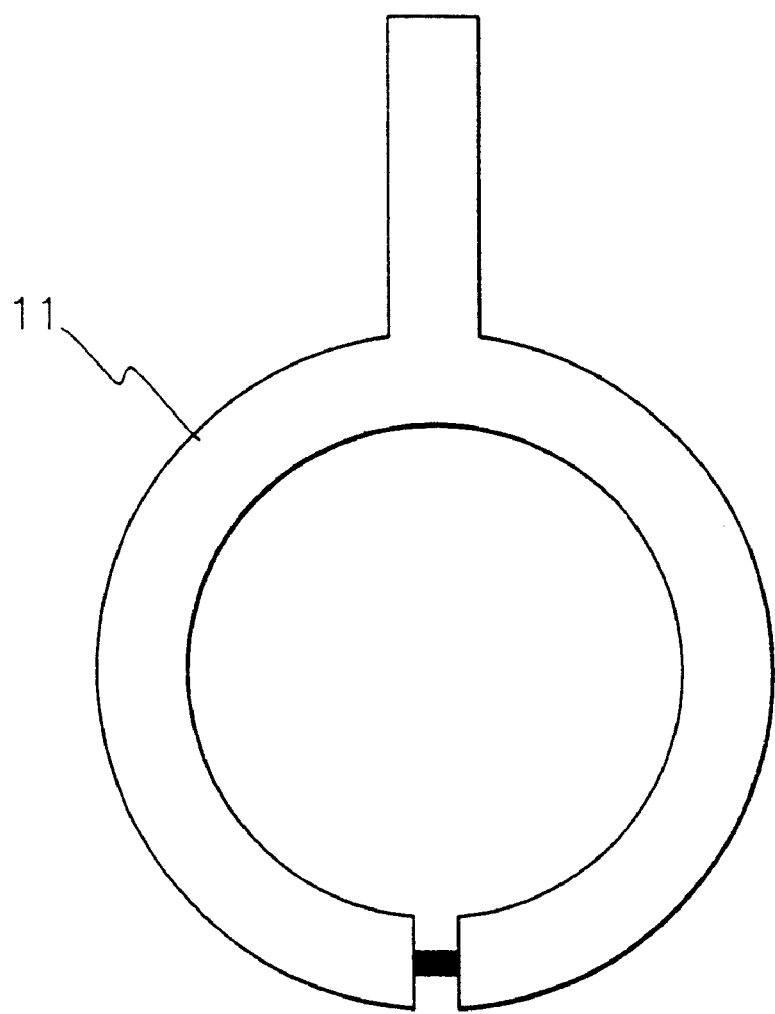
FIG. 16 is a plan view showing a structure of a conventional shielded loop.

In FIG. 6, as a magnetic field sensor 46, a multilayer structure is adopted. The magnetic field sensor 46 has a structure in which the coaxial cable 11 of a conventional shielded loop type magnetic field sensor shown in FIG. 16 is replaced with a triplate strip line. This can theoretically be fabricated by a semiconductor device fabrication process and suitable for a smaller size. For this reason, a resolving power which is required for measurement on an emitted electromagnetic field of a semiconductor device can be sustained. In the example shown in FIG. 6, the sensor is constructed from a three layer base plate. The front-most layer is a first layer (ground layer) 501, and then a second layer (a signal layer) 502 and a third layer (a ground layer) 503 in the order as viewed on the figure.

The first layer 501 and the third layer 503 are constructed from a C shaped conductor pattern 504 and a straight line conductor pattern 505 which is connected to the C shaped conductor pattern 504 at the middle point of continuous side of letter C(left side). An end of the C shaped conductor pattern 504 is connected to a U shaped conductor pattern 507 of the second layer 502 through a via 506. The second layer 502 is constructed from the U shaped conductor pattern 507 and a straight line conductor pattern 508 which is connected to an end of the U shaped pattern 507. The layers are respectively provided with signal line holes 510 and ground holes 511 for attaching a coaxial connector 509.

The straight line conductor pattern 508 of the second layer 502 is guided to a pad 512 on the first layer 501 through a via provided in the signal line hole 510 and connected thereto by soldering. The straight line conductor patterns 505 on the first layer 501 and the third layer 503 are connected to each other through a via provided in the ground hole 511, and guided to the pad 513 provided on the first layer 501 and then connected thereto by soldering. The magnetic field sensor 46 has a square loop, being different from a circular shape of the conventional shielded loop, and therefore, can efficiently be positioned close to interconnection. In this case, it is especially important that a shape of the fore end of the C shaped conductor pattern is straight line.

Figure 7:
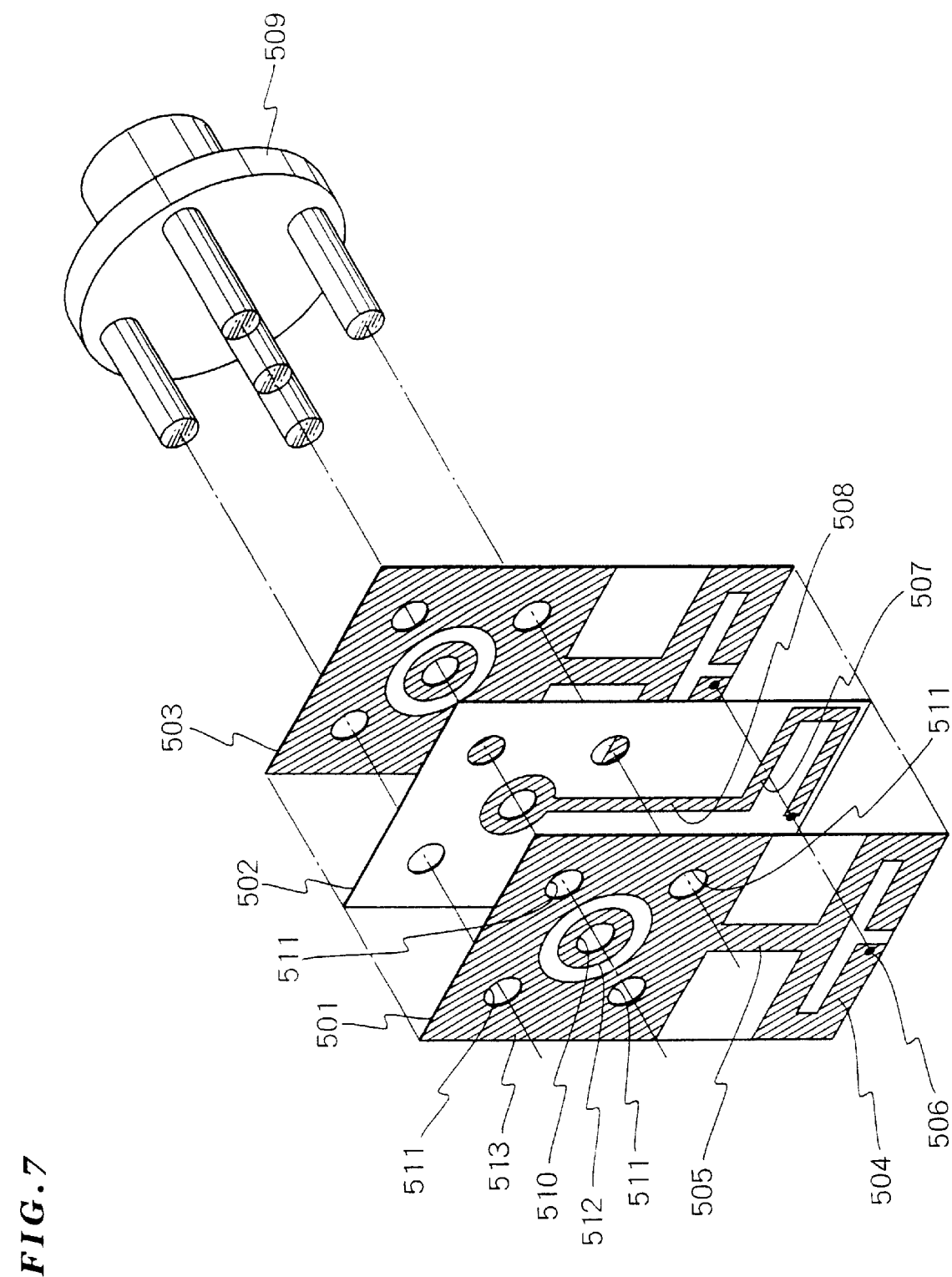
FIG. 7 is a perspective view showing a construction to improve a sensitivity of the multilayer magnetic field sensor shown in FIG. 5.

Alternatively, as shown in FIG. 7, it is also possible to form the C shaped conductor pattern of a fore end portion of a magnetic field sensor in such a manner that the portion has the same width as that of a base member. In this case, while a spatial resolving power is reduced in a longitudinal direction, the maximum sensitivity can be attained in a limited space of the base member. In the case where an object for measurement is, for example, an interconnection conductor pattern on a print circuit board, the magnetic field sensor is effective for measurement of a high frequency magnetic field on an interconnection and an interconnection current if the magnetic field sensor is used in a range in which an influence of a wave length of a interconnection signal can be neglected.

Figure 8A:
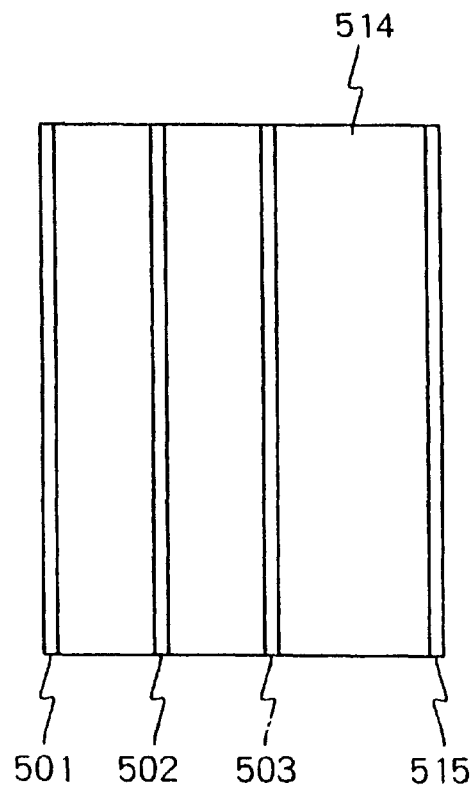
FIG. 8 (A) is a diagram showing a layer configuration of a multilayer magnetic field sensor having a reinforcement base member on one side, and FIG. 8 (B) is a diagram showing a layer configuration of a multilayer magnetic field sensor having reinforcement base members respectively on both sides.
Figure 8B:
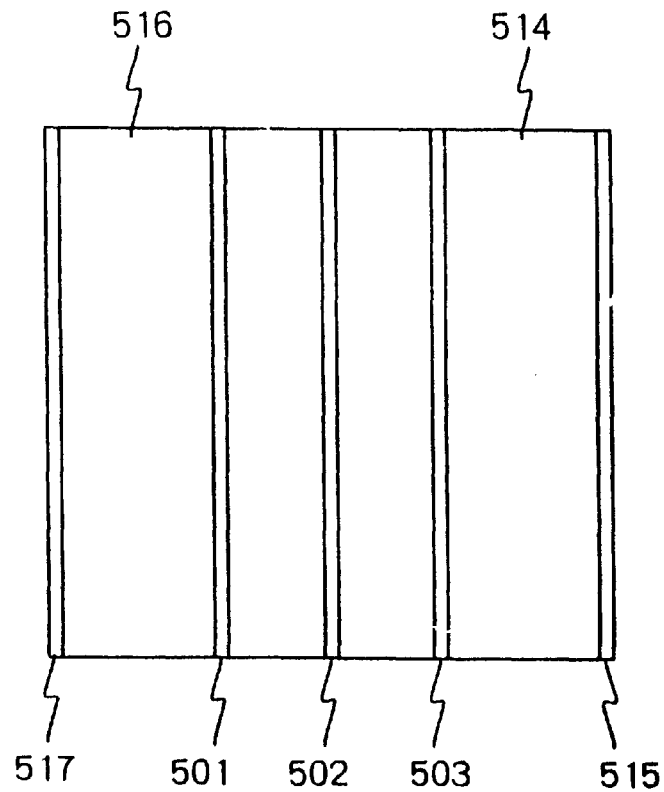

In the above described three layer structure, there is the case, by chance, where the structure cannot secure a sufficient strength according a thickness of a base member (dielectric). In that case, by providing a base member 514 besides the ground layer 513 as shown in a layer construction of FIG. 8 (A), the strength of the structure is strengthened. By providing a base member 516 of the same material as that of the base member between the layers on the left side of the first layer as in FIG. 8(B), a symmetrical structure with respect to the second layer as the center can be realized. When a thickness of an additional base member is close to those of the base members which constitute the layers while adopting this kind of structure, electrical characteristics of the magnetic field sensor can be stabilized and the additional base member can also play a role as a reinforcement member. When additional base members 514, 516 each have a thickness sufficiently larger than that of the base member between the layers, the characteristics of the magnetic field sensor can be stabilized, even if the thickness are made not to be equal to that between the layers. Below, there will be shown an example of the case where a base member 514 is provided on one side of the three layer structure.

Figure 9:
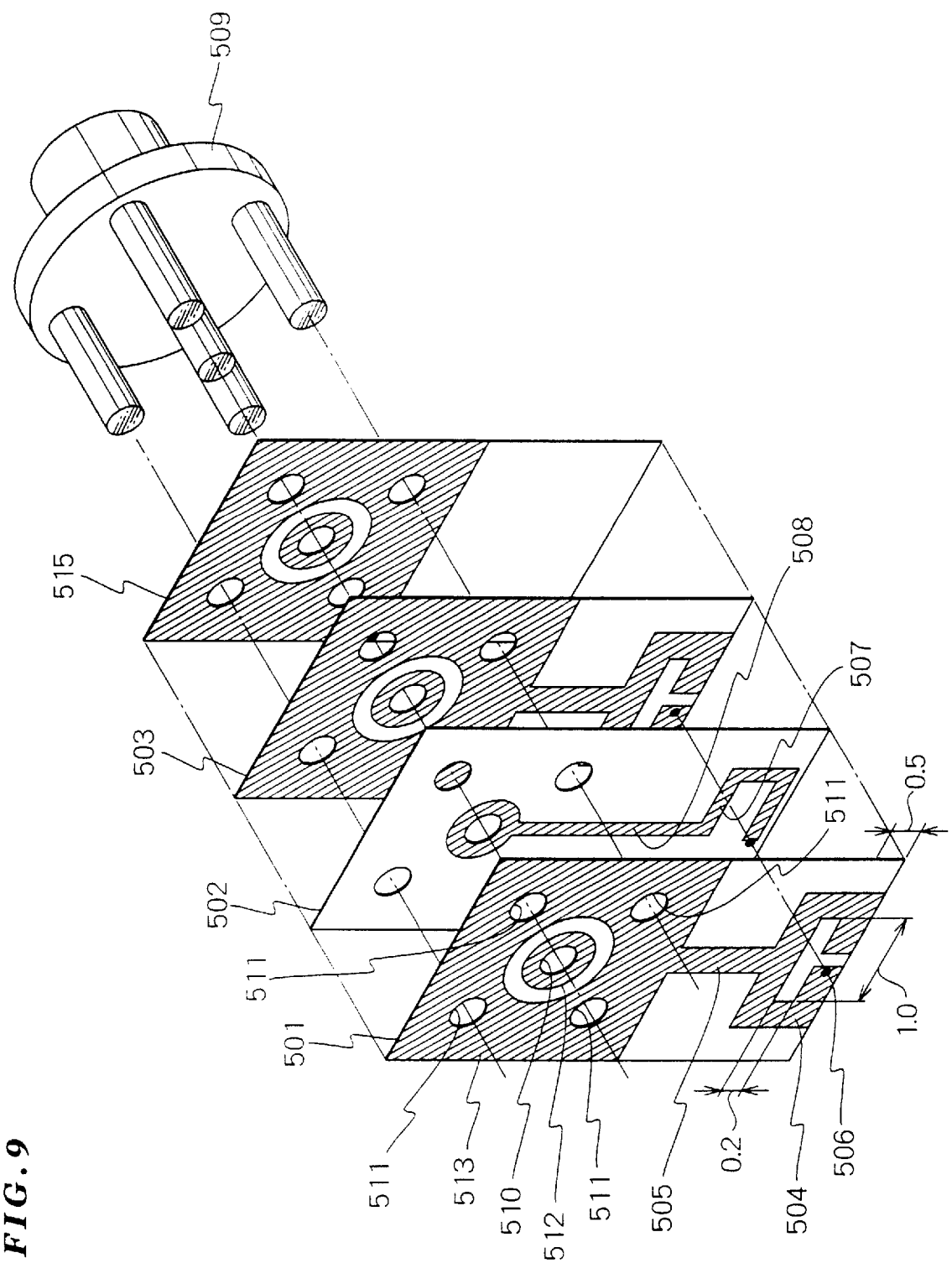
FIG. 9 is a perspective view showing a construction of a multilayer magnetic field sensor having a fourth layer.

When a base member 514 is added, the connector 509 is mounted on the base member 514 side for an electrical characteristic reason and there is a chance where it is necessary for the fore end of a pin of the connector 509 to be connected to the first layer. In the case, there arises a necessity to provide a fourth layer 515 in order to connect a circular outside conductor portion of the connector 509 to a rectangular conductor pattern as in FIG. 9. The fourth layer 515 has a rectangular conductor pattern of the same size as that of pads of the first layer 501 and the third layer 503. Since the fourth layer 515 is used as connection of the connector, the fourth layer 515 is kept in electrical connection to the first and third layers using a via. Also, in the case of FIG. 8(B) where base members are added on both sides, the fifth layer 517 on the base member 516 may be formed so as to have the same conductor pattern as that of the fourth layer 515.

Figure 10A:
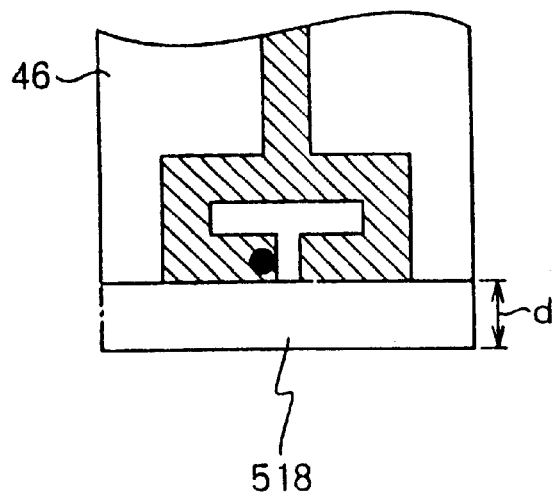
FIGS. 10(a), (b) are front views showing configuration of multilayer magnetic field sensors.
Figure 10B:
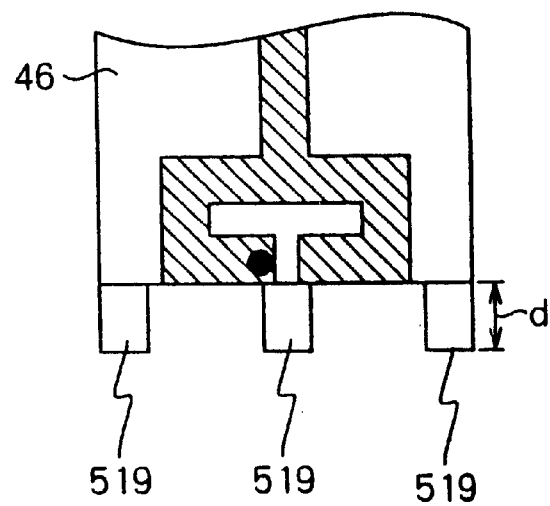

Besides, as shown in FIGS. 10(a), 10(b), when a base member 518 or a base member 519 is added on the lower side to which a via is located close, a distance d to an object for measurement can be controlled. If the fore end of the magnetic field sensor is put into contact to the object for measurement, measurement at a given distance can be performed. FIG. 10(A) is an example in which a base member 518 is provided across the whole length of the side. If the base member 519 is provided in part of the side as in FIG. 10(b), means can be provided which can mechanically stabilize the fore end of the sensor corresponding to a shape or deflection of an object for measurement when in contact.

Figure 11:
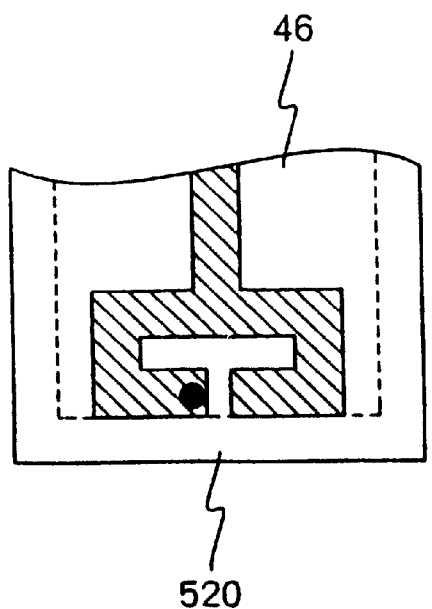
FIG. 11 is a front view of a multilayer magnetic field sensor having a base member outside a C shaped pattern.
Figure 12A:
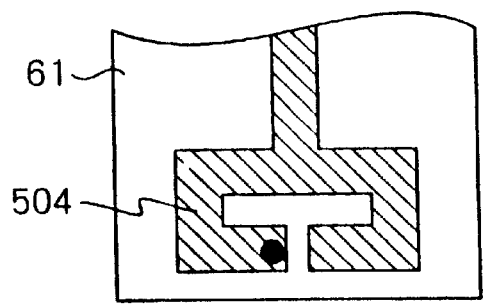
FIGS. 12(A) to (F) are diagrams showing steps of a fabrication process for a multilayer magnetic field sensor.
Figure 12D:
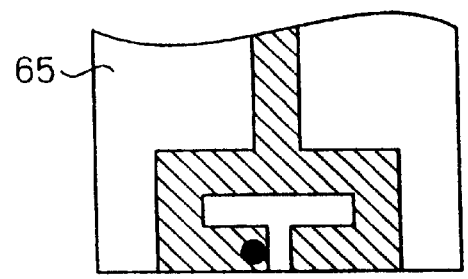
Figure 12B:
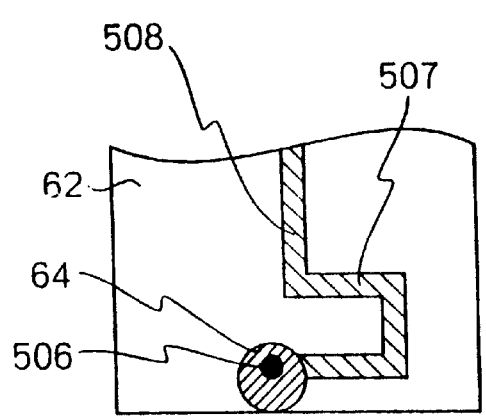
Figure 12E:
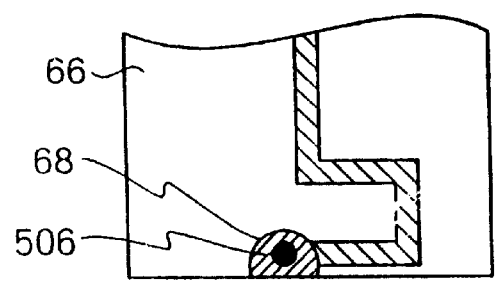
Figure 12C:
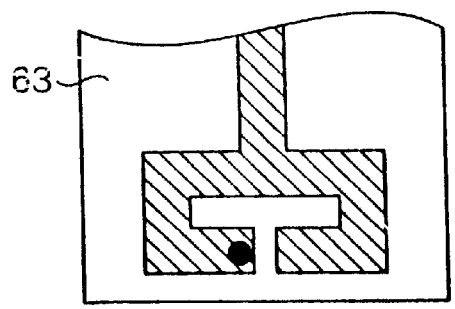
Figure 12F:
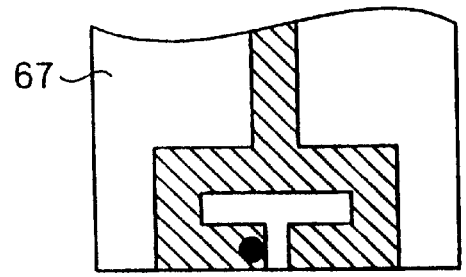

Since a shielded loop magnetic field sensor prepared with a conventional semi-rigid coaxial cable has a structure in which the interior of the loop which works as a magnetic field sensor is filled with air and an empty hole, the sensor is easy to be deformed and therefore it is required know-how to fabricate the sensor. However, since a magnetic field sensor of the present invention has a stacked layer structure, a structure that dielectric is provided inside a C shaped conductor pattern which works as a magnetic field sensor is realized. Hence, the structure is mechanically stable and has an advantage that a special processing such as forming a hole is not required. Besides, as in FIG. 11, by using a board of a larger size than the outer size of the magnetic field sensor at the beginning of its fabrication process, it becomes easier to provide the base member 520 outside the C shaped conductor pattern, whereby a fabrication process can be very flexible.

While a via for connection of the first, second and third layers therebetween is formed at the fore end of the magnetic field sensor, there is a chance that a land 64 of the via 506 is large as shown in FIG. 12 (b). The via 506 is formed with eccentricity from the center of the conductor pattern 507 of the second layer so that the via 506 shown in the figure is not extended toward the inside too much. In this case, since a distance from the sensor to the object for measurement is large, there arise problems, by chance, that a spatial resolving power is decreased and therefore noise in the surrounding space is picked up with ease. In such cases, by connecting with a via having a semicircular land or a via of the shape of a semicircle, as shown in FIG. 12 (e), an increase in distance from the sensor to the object can be decreased.

FIGS. 12(a) to 12(f) show a fabrication process for a multilayer magnetic field sensor having a semicircular land or via. First of all, as shown in FIGS. 12 (a) to (c) in the left side, a first layer 61, a second layer 62 and a third layer 63 are formed by etching. In the figure, parts where connectors are mounted are omitted. When a via 506 is formed, a land 64 is necessary. However, if the diameter of the land 64 is larger than the width of a C shaped conductor pattern 504, the land 64 should be confined within the inner side of the ring-like C shaped conductor pattern 504. In order to do this, the land 64 extended over the periphery of the outer side of the C shaped conductor. Further, an extended part of the land 64 outside the ring-like C shaped conductor pattern is removed, along the lower side of the C shaped conductor pattern 504. Structures after the removal of the extended part of the land 64 are shown in FIGS. 5(d) to 5(f) each of which representing: the first layer 65, the second layer 66 and the third layer 67 where the land 68 of the second layer has a circle a part of which is cut off.

The magnetic field sensor 46 can be fabricated according to the following process. In the first step, a second layer 502 having a signal line constituted of a U shaped conductor pattern of the second layer 507 and a straight line conductor pattern 508 connected to an end of the U shaped conductor pattern 507 is sandwiched between first and third layers 501, 503, which work as grounds, each having a C shaped conductor pattern 504 and a straight line conductor pattern 508 connected to a middle point of the continuous side(left side) of C shaped conductor pattern 504. In the second step, the first, the second and the third layers are fixed in the order with additional insulating layers inserted therebetween while sequentially superposing and at the same time, an end of the U shaped conductor pattern of the second layer is connected to an end of each of the C shaped conductor patterns of the first and third layers by way of a via while passing through a gap between the non-continuous side of C shaped conductor patterns.

In the course of superposition, not only is a land which is required in providing the via for the second layer having the U shaped conductor pattern wherein the land is confined within inside of a ring-like C shaped conductor pattern when the diameter of the land is larger than the width of the C shaped conductor pattern, but also positioning is conducted so that the land is extended over the outside of the ring-like C shaped conductor pattern. In addition, an extended part of the land outside the ring-like C shaped conductor pattern is removed along the C shaped conductor pattern 504.

While a magnetic field sensor has to receive a magnetic field only, there is a possibility to receive an electric field, though it is not much. For that reason, an influence of the electric field can be eliminated by inserting an attenuator 47 connected to the magnetic field sensor. Of the entire output of the magnetic field sensor, an output in a normal mode thereof is originated from a magnetic field but an output in a common mode thereof is generally originated from an electric field. While the output in the normal mode is guided to the measurement unit without any problem, the output in the common mode causes a resonance between the measurement unit and the magnetic field sensor due to mismatching. Besides, the output in the normal mode is very much larger in amplitude than that of the common mode. Accordingly, the common mode which is considered to be caused by an influence of an electric field can be eliminated by inserting an attenuator between the magnetic field sensor and the measurement unit.

As shown in FIG. 5, the magnetic field sensor 46 is disposed at a height so as to contact the upper surface of the semiconductor device package 41, and the print circuit board 42 which is mounted on the fixing jig 43 is fixed so that scanning axes in two-dimensional scanning of the magnetic field sensor 46 are respectively parallel to the sides of the semiconductor device package 41 facing the magnetic field sensor 46. An evaluation region is adjusted so as to include the entire semiconductor device package 41 and the magnetic field sensor 46 is located at an origin (0, 0) set as an initial state. Then, the print circuit board 42 is made to enter the operating state. A frequency in measurement is set to 320 MHz which is already known as a frequency at which unnecessary emission is large, as a result of measurement in an emitted far-field measurement. The spectrum analyzer 49 is set so that it can measure an amplitude at 320 MHz.

An x-y plane parallel to the upper surface of the semiconductor device package 41 is scanned with the magnetic field sensor 46 by the scan jig 45 and an output of the magnetic field sensor 46 at each set of coordinates is measured by the spectrum analyzer 49 with the attenuator 47 and the amplifier 48 interposed therebetween to attain a two-dimensional magnetic field (Hx) distribution. Then, the magnetic field sensor 46 is rotated about the z coordinate axis along a vertical direction as an axis of rotation by 90 degrees and thereafter an two-dimensional magnetic field (Hy) distribution is attained in the same way. Thus attained two magnetic field distributions are synthesized by the following equation (7) to obtain one magnetic field distribution 71 in FIG. 6.

[Equation 3]

$$H = H\sqrt{H_x^2 + H_y^2} \qquad (7)$$

Figure 14A:
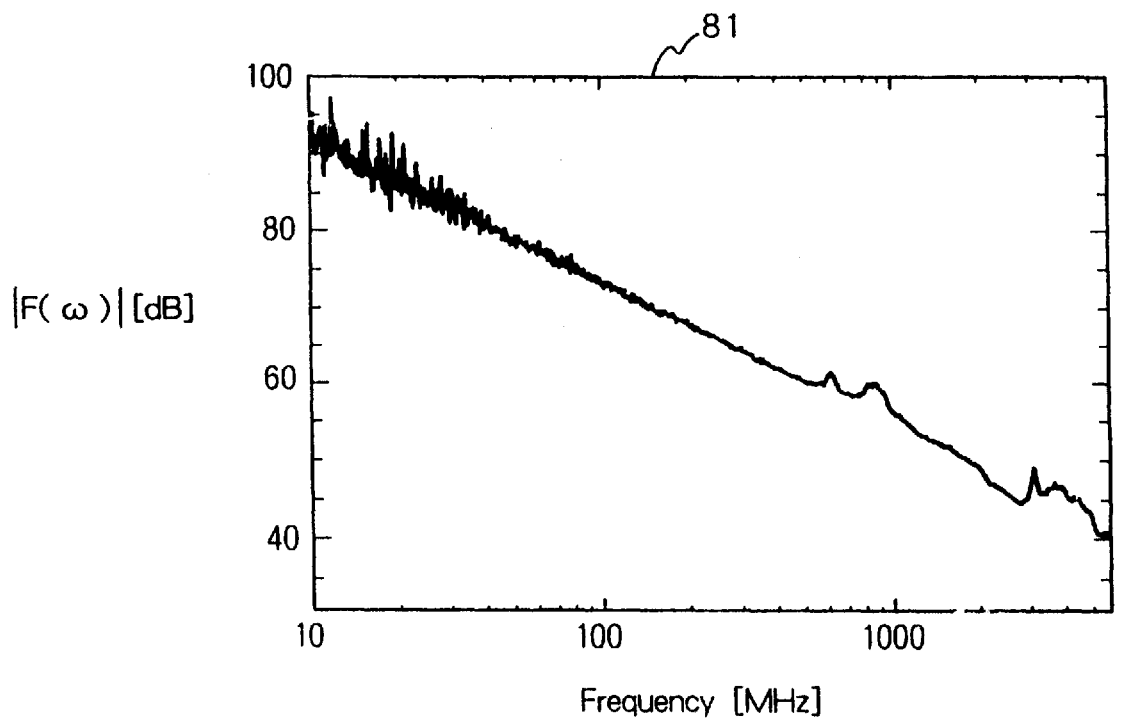
FIGS. 14(A), (B) are graphs showing voltage vs. magnetic field conversion characteristics of a multilayer magnetic field sensor.
Figure 14B:
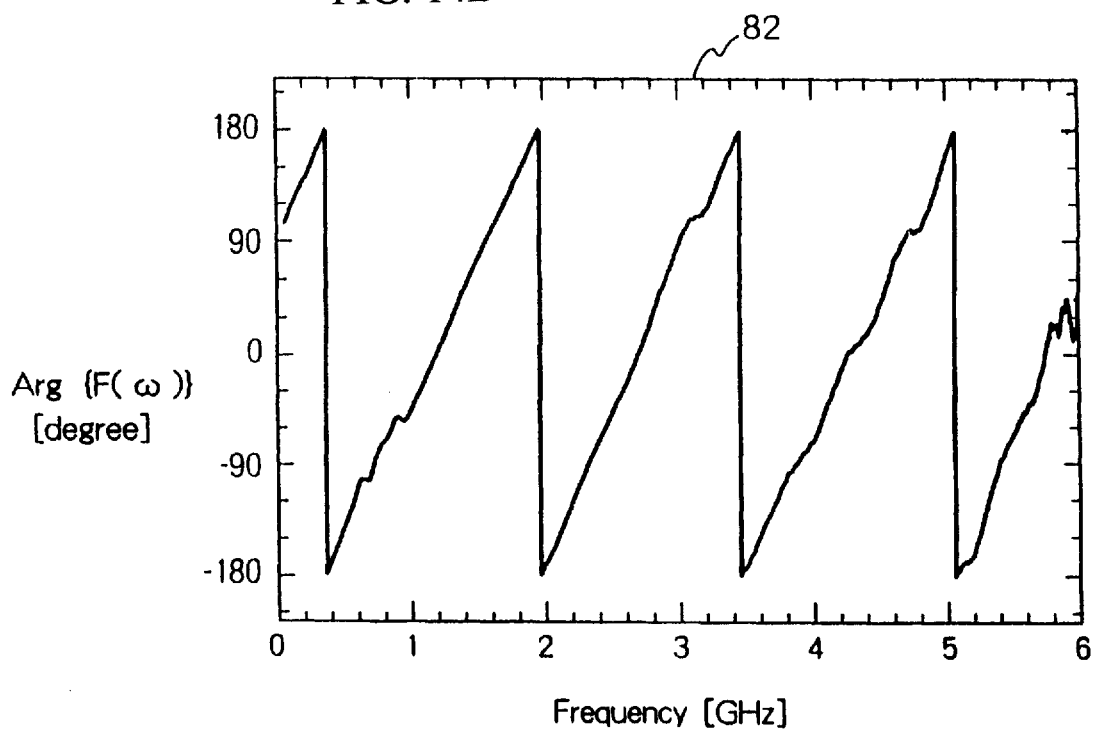
Figure 15:
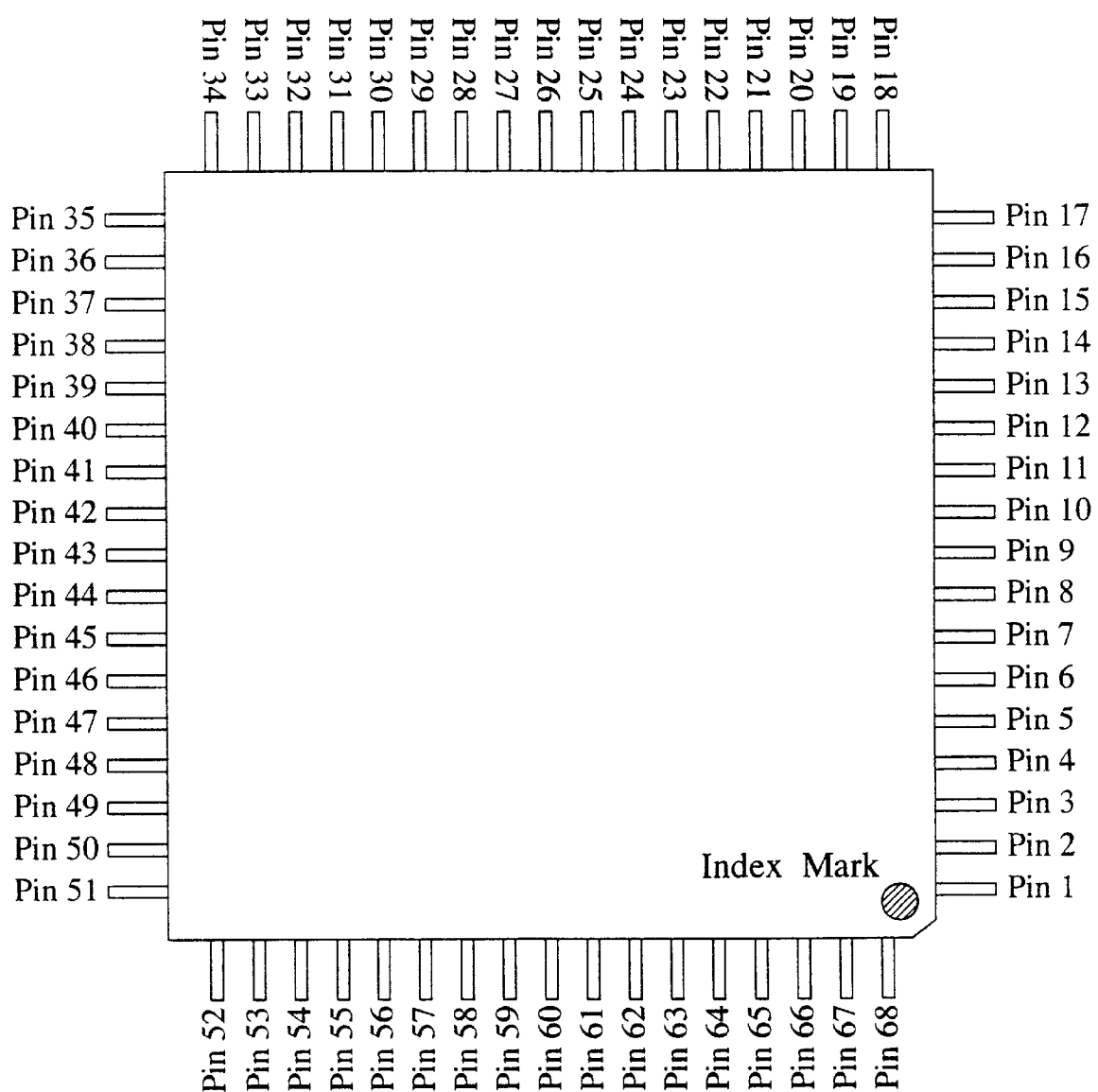
FIG. 15 is a plan view showing pin assignment of a semiconductor device package for evaluation.

However, since values of an output voltage of the magnetic field sensor 46 are obtained in the spectrum analyzer 49, there is a need to know a calibration coefficient to convert an output voltage to a magnetic field. Calibration coefficient characteristics of the magnetic field sensor 46 are shown in FIGS. 14(A), 14(B) and the figures show calibration coefficients for a amplitude 81 and a phase 82. A strength and a phase of a magnetic field are obtained by applying the coefficients to an output voltage measured by the spectrum analyzer 49. Only magnetic field strength distributions are shown in FIGS. 13(A), 13(B). Square frames 72 appeared in the distribution maps 71 of FIGS. 13(A), 13(B) indicate the outline of the semiconductor device package 41.

From the distribution 71 shown in FIG. 13(A), it is confirmed that a magnetic field is stronger in stripe patterns along lead frames which are radially extended from the center of the semiconductor device package. When the pin assignment 91 of the semiconductor device package 41 for evaluation shown in FIG. 14 is referred to with respect of the patterns, pins each of which has a high emitted magnetic field can be specified. On the other hand, a two-dimensional magnetic field distribution 101 attained when a conventional magnetic field sensor of a loop radius 5 mm (FIG. 16) is used is shown in FIG. 13 (B) and only a smaller number of large amplitudes are found in the distribution. This is considered because a resolving power is reduced for the reason that since a loop is large, magnetic fields of lead frames are synthesized before measurement with the result that strengths of amplitudes close to each other are averaged.

According to the embodiment, as described above, the following effects are realized.

A first effect is that evaluation can be performed on any of semiconductor devices on a wafer, in a package and in a mounted state on the print circuit board. In the cases of semiconductor devices on a wafer or in a package, EMI evaluation can be performed on the specimen mounted on a general purpose semiconductor tester or the like. In the case where the semiconductor device is mounted on the print circuit board, EMI evaluation can be performed as shown in the example.

The reason why is that since a non-contact electromagnetic field sensor is used, any interconnection can be evaluated with no evaluation pad used for a measurement probe.

A second effect is that the evaluation can be performed at a low cost.

The reason why is that there is no need to prepare a mounting board dedicated for each different kind of semiconductor device in certain state for evaluation.

A third effect is that an interconnect and a lead frame with large unnecessary emission can quickly be specified with ease.

The reason why is that an interconnect and a lead frame in question can be specified by first taking a photograph of each object, then measuring a two-dimensional electromagnetic field distribution in the vicinity of the semiconductor device and further collating both kinds of image information thus attained with each other to visually confirm the result.

A fourth effect is that an interconnect and a lead frame with large unnecessary emission can be specified with precision.

The reason why is that by using a small-sized magnetic field sensor of a stacked layer structure, a two-dimensional magnetic field distribution with high resolution is attained and then in order to specify an interconnect and a lead frame, the two-dimensional magnetic field distribution is related with positional information of an interconnect and a lead frame of a semiconductor device, for example pin assignment.

Since the present invention is configured and functioned as described above, an electromagnetic field distribution sensor measures a distribution of an electromagnetic field emitted from a semiconductor device and a part specifying unit specifies a part with high emitted electromagnetic field based on positional information of an electromagnetic field distribution such as a distribution image. For example, since a part of a semiconductor device such as an interconnect, a lead frame or the like with large emitted electromagnetic field strength are specified, therefore, evaluation of an electromagnetic field emitted from a semiconductor device can be performed on each part thereof and as a result, an excellent semiconductor device evaluation apparatus which has heretofore not been encountered can be provided.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 10-242916 (Aug. 28, 1998) including specification, claims, drawings and summary are incorporated herein by reference in its entirety.

What is claimed is:

1. A semiconductor device evaluation apparatus comprising:

an imaging unit for obtaining an image of a semiconductor device;

an electromagnetic field measurement unit for measuring an electromagnetic field distribution emitted from the semiconductor device;

an electromagnetic field distribution extracting unit for extracting a distribution of an electromagnetic field higher than a threshold value determined in advance and positional information of the distribution from an electromagnetic field distribution of a semiconductor device which is measured by the electromagnetic field measurement unit collated with the image; and a part specifying unit for specifying a part of the semiconductor device which is high in emitted electromagnetic field among parts thereof based on the positional information of the electromagnetic field distribution which is extracted by the electromagnetic file distribution extracting unit.

2. A semiconductor device evaluation apparatus comprising:

an electromagnetic field measurement unit for measuring a two-dimensional electromagnetic field distribution emitted from a semiconductor device in a plane parallel to an upper surface of the semiconductor device;

a distribution image generation unit for not only extracting a distribution of an electromagnetic field higher than a threshold value determined in advance from the electromagnetic field distribution of the semiconductor device measured by the electromagnetic field measurement unit but also converting the extracted electromagnetic field distribution to a distribution image in the two-dimensional plane;

an image collation unit for collating the distribution image generated by the distribution image generation unit with a projected image, generated in advance, of an interconnect and a lead frame of the semiconductor device; and an emission source specifying unit for specifying an interconnect or a lead frame whose images are superposed as an emission source if the images of the electromagnetic field distribution, and the images of the interconnects and lead frames, are superposed on each other in collation by the image collation unit.

3. The semiconductor device evaluation apparatus according to claim 2, wherein the distribution image generation unit is provided with a function of segmenting an electromagnetic field emitted from the semiconductor device between the maximum and minimum strength level into a plurality of strength level intervals according to emission strength and the emission source specifying unit is provided with a capability of specifying an interconnect or a lead frame which corresponds to each of the emission strength level intervals.

4. The semiconductor device evaluation apparatus according to claim 3, wherein the emission source specifying unit is provided with a function of not only rearranging lead frames in the order of emission strength level intervals, but also transmitting the rearranged lead frame information in the new order of the lead frames as an output to the outside.

5. The semiconductor device evaluation apparatus according to claim 4, wherein the distribution image generation unit is provided with a function of narrowing the emission strength level intervals till no change appears in the newer order of the strength level intervals of leads after rearrangement of the strength level intervals of the lead frames by the emission source specifying unit.

6. The semiconductor device evaluation apparatus according to claim 5, wherein the emission source specifying unit is provided with a capability which transmits synthesized information of the lead frames rearranged according to the emission strength level intervals and pin assignment made by referencing to the pin assignment database showing functions of the lead frames in a circuit defined in advance as an output to the outside.

7. The semiconductor device evaluation apparatus according to claim 6, wherein the electromagnetic field measurement unit comprises:

a signal layer having a signal line; and a magnetic field sensor having a ground layer which works as a ground for the signal layer.

8. The semiconductor device evaluation apparatus according to claim 7, wherein the emission source specifying unit is provided with a function which calculates an electric current value in the semiconductor device which is a cause of an emitted electromagnetic field based on a voltage showing the magnetic field sensed by the magnetic field sensor and a magnetic permeability of a medium surrounding the semiconductor device.

9. The semiconductor device evaluation apparatus according to claim 8, wherein an attenuator for eliminating a common mode of an output of the magnetic field sensor is used together with the magnetic field sensor.

10. A semiconductor device evaluation apparatus comprising;

a mounting section for mounting a semiconductor device for evaluation;

a semiconductor device drive unit for driving the semiconductor device mounted on the mounting section;

an electromagnetic field sensor for sensing an electromagnetic field emitted from the semiconductor device which is driven by the semiconductor device drive unit;

a measurement unit for measuring an output of the electromagnetic field sensor;

an image pick-up unit for taking a photograph of patterns of interconnects or lead frames of the semiconductor device;

a scan unit for conducting scanning with the electromagnetic field sensor and the image pick-up unit in three coordinate axis directions;

an input unit to which information on a scan range, a scan pitch, a scan speed of the scan unit or the like, and information on settings of the image pick-up unit and the measurement unit and the like are supplied as inputs;

a control unit for controlling the scan unit, the image pick-up unit, the measurement unit according to information which is supplied as inputs to the input unit; wherein the control unit also receives information from the measurement unit and the image pick-up unit;

a record unit which prepares and stores a two-dimensional electromagnetic distribution based on information obtained from the measuring unit and the image pick-up unit by way of the control unit;

an arithmetic unit which not only extract an emitted electromagnetic field distribution higher than a threshold value which can arbitrarily be set based on a two-dimensional electromagnetic field distribution which is prepared in the record unit, but also specifies an interconnect and a lead frame of the semiconductor device which are large in emission quantity by projecting the extracted electromagnetic field distribution on the image from the image pick-up unit; and an indication unit for indicating the two-dimensional electromagnetic field distribution prepared by the record unit, the emitted electromagnetic field distribution with a high strength having a linear shape prepared by the arithmetic unit and the image from the image pick-up unit.

11. A semiconductor device evaluation apparatus comprising:

an imaging means for obtaining an image of a semiconductor device;

an electromagnetic field measurement means for measuring an electromagnetic field distribution emitted from the semiconductor device;

an electromagnetic field distribution extracting means for extracting a distribution of an electromagnetic field higher than a threshold value determined in advance and positional information of the distribution from an electromagnetic field distribution of a semiconductor device which is measured by the electromagnetic field measurement means collated with the image; and a part specifying means for specifying a part of the semiconductor device which is high in emitted electromagnetic field among parts thereof based on the positional information of the electromagnetic field distribution which is extracted by the electromagnetic field distribution extracting means.

12. The apparatus of claim 1, wherein the imaging device is a camera.

13. The apparatus of claim 1, further comprising a drive unit for applying a electronic signal directly to the semiconductor device such that the semiconductor device emits the electromagnetic field.

* * * * *